US012640221B2

(12) United States Patent
Patel

(10) Patent No.: US 12,640,221 B2
(45) Date of Patent: May 26, 2026

(54) HOST-TO-DEVICE INTERFACE CIRCUITRY TESTING

(71) Applicant: Advanced Micro Devices, Inc., Santa Clara, CA (US)

(72) Inventor: Nehal Patel, Santa Clara, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 18/343,377

(22) Filed: Jun. 28, 2023

(65) Prior Publication Data

US 2025/0006290 A1     Jan. 2, 2025

(51) Int. Cl.
*G11C 29/12*          (2006.01)
*G11C 29/36*          (2006.01)
*G11C 29/56*          (2006.01)

(52) U.S. Cl.
CPC .......... *G11C 29/36* (2013.01); *G11C 29/1201* (2013.01); *G11C 29/56* (2013.01); *G11C 2029/3602* (2013.01); *G11C 2029/5602* (2013.01)

(58) Field of Classification Search
CPC ..... G11C 29/36; G11C 29/1201; G11C 29/56; G11C 2029/3602; G11C 2029/5602
See application file for complete search history.

(56) References Cited

U.S. PATENT DOCUMENTS

| | | | | |
|---|---|---|---|---|
| 5,982,681 A | * | 11/1999 | Schwarz | ................. G06F 11/27 |
| | | | | 714/E11.169 |
| 11,428,737 B1 | * | 8/2022 | Ziaja | ................... G06F 11/2236 |

| | | | | |
|---|---|---|---|---|
| 2010/0157703 A1 | | 6/2010 | Fischer et al. | |
| 2018/0374555 A1 | * | 12/2018 | Kwon | .................... G11C 29/38 |
| 2020/0082899 A1 | * | 3/2020 | Lee | ........................ G11C 16/32 |
| 2020/0336151 A1 | | 10/2020 | Olumuyiwa et al. | |
| 2021/0055347 A1 | | 2/2021 | Poppe et al. | |
| 2021/0304835 A1 | * | 9/2021 | Fujiwara | .......... G11C 29/12015 |

FOREIGN PATENT DOCUMENTS

| | | |
|---|---|---|
| KR | 1020150145694 A | 12/2015 |
| KR | 1020160078396 A | 7/2016 |

OTHER PUBLICATIONS

International Search Report and Written Opinion for International Application No. PCT/US2024/033357 dated Sep. 27, 2024, 11 pages.

* cited by examiner

*Primary Examiner* — Mohammed A Bashar
(74) *Attorney, Agent, or Firm* — Volpe Koenig

(57) ABSTRACT

Some implementations provide systems methods and devices for integrated circuit self-test. The integrated circuit includes interface circuitry configured to read test data and to write the test data into memory of the integrated circuit. The integrated circuit also includes test circuitry configured to test the interface circuitry based on the test data written into memory of the integrated circuit. Some implementations provide an integrated circuit configured for storing and reading data. The integrated circuit includes circuitry configured to write or read a first portion of data to or from a first memory via BIST circuitry of the first memory until a first BIST counter saturates. The integrated circuit also includes circuitry configured to write or read a second portion of the data to or from a second memory via BIST circuitry of the second memory until a second BIST counter saturates.

20 Claims, 20 Drawing Sheets

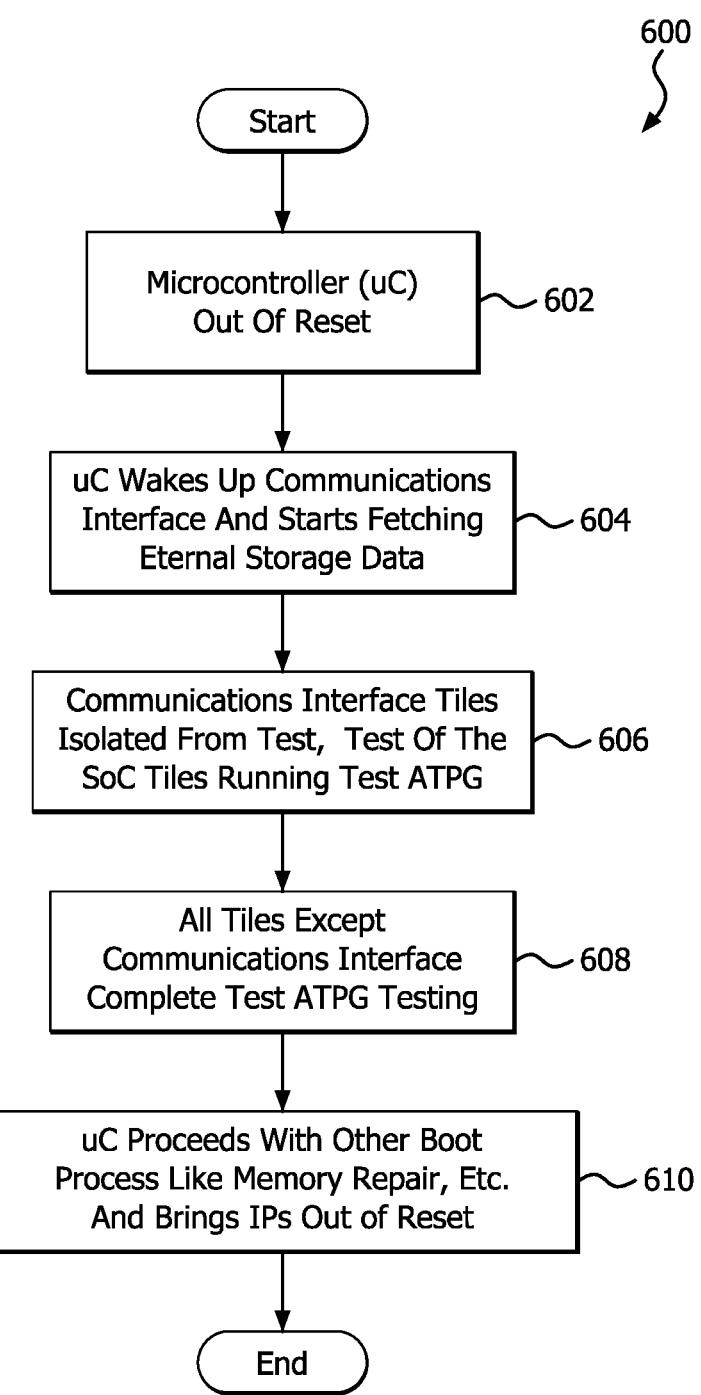

600

Start

Microcontroller (uC)
Out Of Reset
~602 uC Wakes Up Communications
Interface And Starts Fetching
Eternal Storage Data
~604

Communications Interface Tiles
Isolated From Test,  Test Of The
SoC Tiles Running Test ATPG
~606

All Tiles Except
Communications Interface
Complete Test ATPG Testing
~608 uC Proceeds With Other Boot
Process Like Memory Repair, Etc.
And Brings IPs Out of Reset
~610

End

FIG. 6

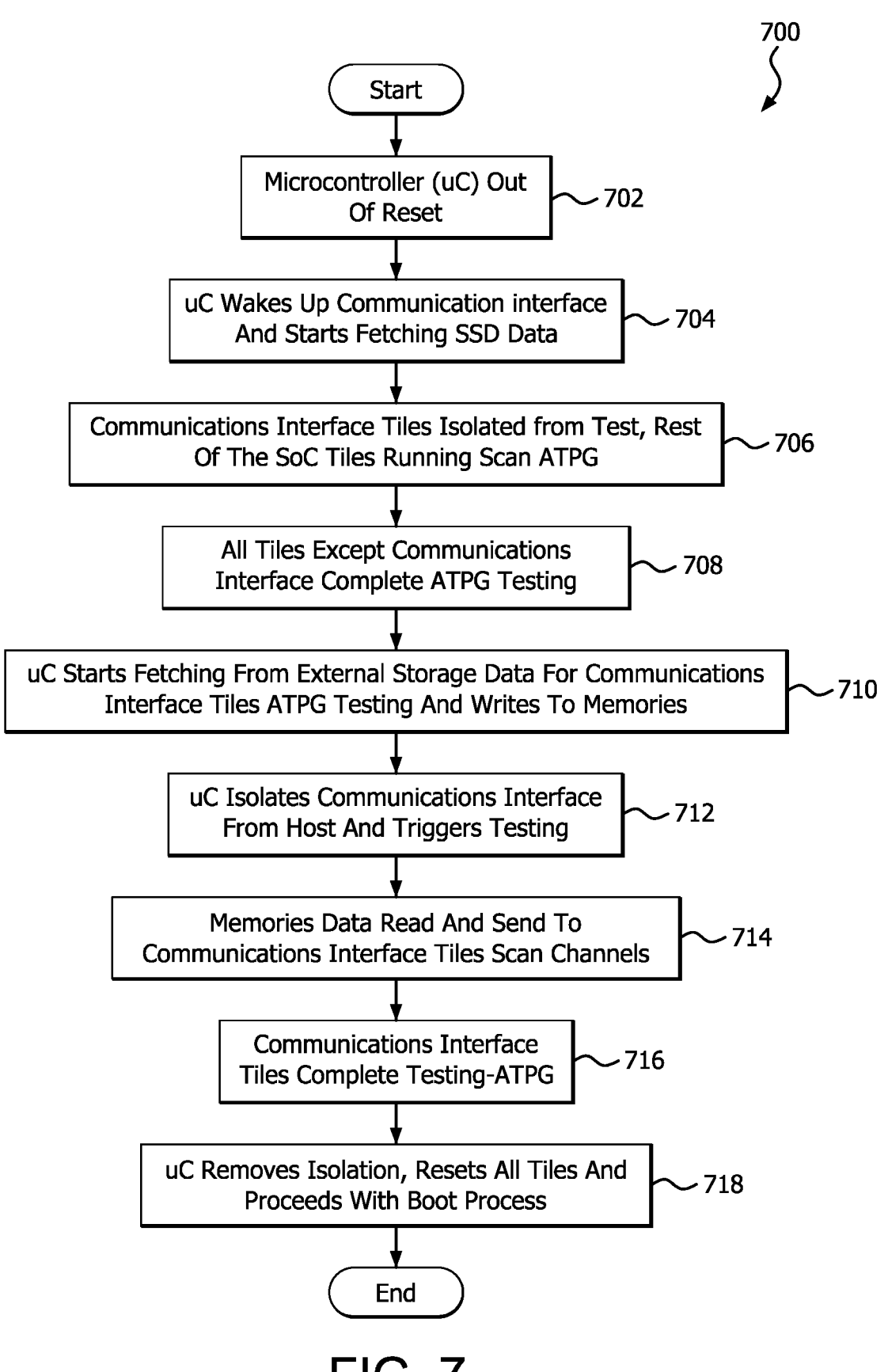

700

Start

Microcontroller (uC) Out
Of Reset ~702 uC Wakes Up Communication interface
And Starts Fetching SSD Data ~704

Communications Interface Tiles Isolated from Test, Rest
Of The SoC Tiles Running Scan ATPG ~706

All Tiles Except Communications
Interface Complete ATPG Testing ~708 uC Starts Fetching From External Storage Data For Communications
Interface Tiles ATPG Testing And Writes To Memories ~710 uC Isolates Communications Interface
From Host And Triggers Testing ~712

Memories Data Read And Send To
Communications Interface Tiles Scan Channels ~714

Communications Interface
Tiles Complete Testing-ATPG ~716 uC Removes Isolation, Resets All Tiles And
Proceeds With Boot Process ~718

End

FIG. 7

HOST-TO-DEVICE INTERFACE CIRCUITRY TESTING

BACKGROUND

Modern integrated circuits (ICs) are enormously complex, and are typically manufactured in large quantities, with a low tolerance for defects. Accordingly, to promote an acceptably low defect rate, modern ICs are designed to be tested automatically using automatic test equipment (ATE). ATE will typically input test data to the IC and compare the data output in response to the test data to expected output data. If the data output in response to the test data does not match the expected output data, the IC may be defective in some way.

BRIEF DESCRIPTION OF THE DRAWINGS

A more detailed understanding can be had from the following description, given by way of example in conjunction with the accompanying drawings wherein:

FIG. 6 is a flow chart illustrating an example method for automatic test of an IC using an onboard microcontroller;

FIG. 7 is a flow chart illustrating an example method for automatic test of an IC using an onboard microcontroller;

DETAILED DESCRIPTION

Figure 1:
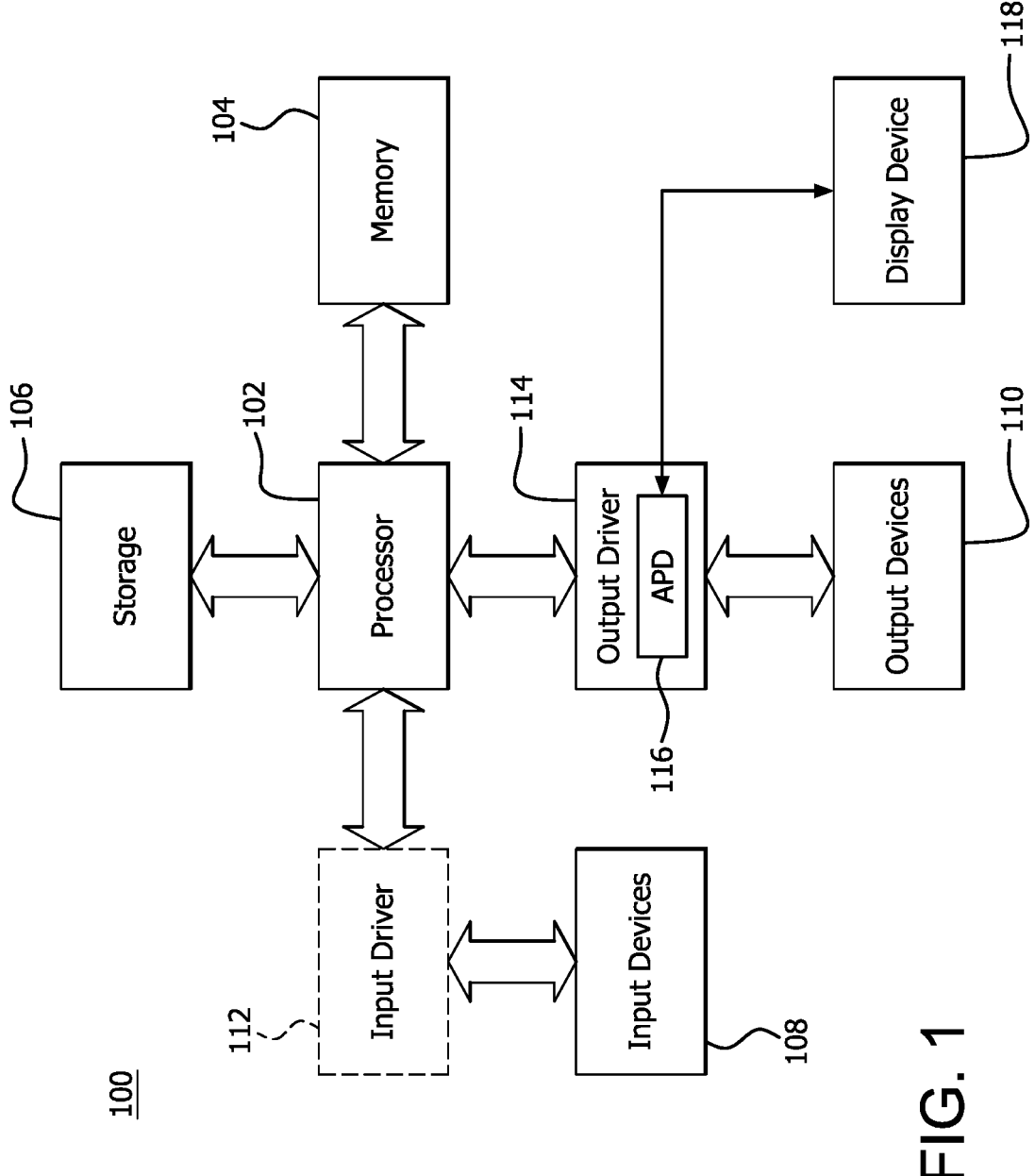
FIG. 1 is a block diagram of an example device in which one or more features of the disclosure can be implemented.

ATE typically inputs test data to an IC under test via a communications interface. The test data is also referred to as a stimulus, test pattern, or scan pattern, in some cases. Some example input interfaces include Peripheral Component Interconnect Express (PCIe) and Universal Serial Bus (USB), however any suitable interface is usable in different implementations. The ATE includes circuitry which implements the interface for communication with circuitry which implements the interface on the IC. Circuitry on the IC (e.g., a scan chain) responds to the input test data, and generates an output to the ATE. The ATE compares the output to an expected output to determine whether the IC is defective. In prior systems, it may be impossible to test the interface circuitry on the IC, e.g., because it is actively receiving the test pattern from the ATE and unavailable for testing. Accordingly, it may be desired to provide systems, methods, and/or devices which address this.

Some implementations provide an integrated circuit configured for self-test. The integrated circuit includes interface circuitry configured to read test data and to write the test data into memory of the integrated circuit. The integrated circuit also includes test circuitry configured to test the interface circuitry based on the test data written into memory of the integrated circuit.

In some implementations, the interface circuitry is configured to read the test data from an external storage device. In some implementations, the memory of the integrated circuit comprises a plurality of memories on a same die as the integrated circuit. In some implementations, the memory of the integrated circuit comprises a plurality of memories within a same package as the integrated circuit. In some implementations, the memory of the integrated circuit comprises a memory pool. In some implementations, the memory of the integrated circuit comprises a plurality of memories configured to be accessed serially. In some implementations, the memory of the integrated circuit comprises a plurality of memories configured to be written to and read from via BIST circuitry. In some implementations, the interface circuitry is configured to write a first portion of the test data into a first memory on the integrated circuit until the first portion of the test data has been entirely written to the first memory, and, after the first portion of the test data has been entirely written, to write a second portion of the test data into a second memory on the integrated circuit until the second portion of the test data has been entirely written to the second memory. In some implementations, the test circuitry is configured to read a first portion of the test data from a first memory on the integrated circuit until the first portion of the test data has been entirely read from the first memory, and, after the first portion of the test data has been entirely read, reading a second portion of the test data from a second memory on the integrated circuit until the second portion of the test data has been entirely read from the second memory. In some implementations, the test circuitry is configured to read the test data from the memory of the integrated circuit, input the test data to the interface circuitry to generate test output data, and to compare the test output data to expected output data.

Some implementations provide a method for testing an integrated circuit. Test data is written into memory of the integrated circuit over interface circuitry of the integrated circuit. The interface circuitry is tested based on the test data written into memory of the integrated circuit.

In some implementations, the test data is written into the memory on the integrated circuit over the interface circuitry of the integrated circuit from an external storage device. In some implementations, the memory of the integrated circuit comprises a plurality of memories on a same die as the integrated circuit. In some implementations, the memory of the integrated circuit comprises a plurality of memories within a same package as the integrated circuit. In some implementations, the memory of the integrated circuit comprises a memory pool. In some implementations, the memory of the integrated circuit comprises a plurality of memories configured to be accessed serially. In some implementations, the memory of the integrated circuit comprises a plurality of memories configured to be written to and read from via BIST circuitry. In some implementations, writing the test data into the memory on the integrated circuit over the interface circuitry comprises writing a first portion of the test data into a first memory on the integrated circuit until the first portion of the test data has been entirely written to the first memory, and, after the first portion of the test data has been entirely written, writing a second portion of the test data into a second memory on the integrated circuit until the second portion of the test data has been entirely written to the second memory. In some implementations, testing the interface circuitry based on the test data comprises reading a first portion of the test data into a first memory on the integrated circuit until the first portion of the test data has been entirely read from the first memory, and, after the first portion of the test data has been entirely read, reading a second portion of the test data from a second memory on the integrated circuit until the second portion of the test data has been entirely read from the second memory. In some implementations, testing the interface circuitry based on the test data written into the memory of the integrated circuit comprises reading the test data from the memory of the integrated circuit, inputting the test data to the interface circuitry to generate test output data, and comparing the test output data to expected output data.

Some implementations provide an integrated circuit configured for storing data. The integrated circuit includes circuitry configured to write a first portion of data to a first memory via BIST circuitry of the first memory until a first BIST counter saturates. The integrated circuit also includes circuitry configured to write a second portion of the data to a second memory via BIST circuitry of the second memory until a second BIST counter saturates.

In some implementations, the integrated circuit includes circuitry configured to trigger writing of the second portion of the data to the second memory based on saturation of the first BIST counter. In some implementations, the first memory and the second memory are comprised of the integrated circuit, and the integrated circuit comprises circuitry configured to read the data from a memory device that is external to the integrated circuit. In some implementations, the first memory and the second memory are comprised of an integrated circuit package, and the integrated circuit comprises circuitry configured to read the data from a memory device that is external to the integrated circuit package. In some implementations, the first memory and the second memory are comprised of an integrated circuit die, and the integrated circuit comprises circuitry configured to read the data from a memory device that is external to the integrated circuit die.

Some implementations provide an integrated circuit configured for retrieving data. The integrated circuit includes circuitry configured to read a first portion of data from a first memory via BIST circuitry of the first memory until a first BIST counter saturates. The integrated circuit also includes circuitry configured to read a second portion of the data from a second memory via BIST circuitry of the second memory until a second BIST counter saturates.

In some implementations, the integrated circuit includes circuitry configured to trigger reading of the second portion of the data from the second memory based on saturation of the first BIST counter. In some implementations, the first memory and the second memory are comprised of the integrated circuit, and the data is read from a memory device that is external to the integrated circuit. In some implementations, the first memory and the second memory are comprised of an integrated circuit package, and the data is read from a memory device that is external to the integrated circuit package. In some implementations, the first memory and the second memory are comprised of an integrated circuit die, and the data is read from a memory device that is external to the integrated circuit die.

Some implementations provide a method for storing data. A first portion of data is written to a first memory via BIST circuitry of the first memory until a first BIST counter saturates. A second portion of the data is written to a second memory via BIST circuitry of the second memory until a second BIST counter saturates.

In some implementations, the saturation of the first BIST counter triggers writing of the second portion of the data to the second memory. In some implementations, the first memory and the second memory are comprised of an integrated circuit, and the data is read from a memory device that is external to the integrated circuit. In some implementations, the first memory and the second memory are comprised of an integrated circuit package, and the data is read from a memory device that is external to the integrated circuit package. In some implementations, the first memory and the second memory are comprised of an integrated circuit die, and the data is read from a memory device that is external to the integrated circuit die.

Some implementations provide a method for retrieving data. A first portion of data is read from a first memory via BIST circuitry of the first memory until a first BIST counter saturates. A second portion of the data is read from a second memory via BIST circuitry of the second memory until a second BIST counter saturates.

In some implementations, the saturation of the first BIST counter triggers writing of the second portion of the data to the second memory. In some implementations, the first memory and the second memory are comprised of an integrated circuit, and the data is read from a memory device that is external to the integrated circuit. In some implementations, the first memory and the second memory are comprised of an integrated circuit package, and the data is read from a memory device that is external to the integrated circuit package. In some implementations, the first memory and the second memory are comprised of an integrated circuit die, and the data is read from a memory device that is external to the integrated circuit die.

FIG. 1 is a block diagram of an example device 100 in which one or more features of the disclosure can be implemented. The device 100 can include, for example, a computer, a gaming device, a handheld device, a set-top box, a television, a mobile phone, server, a tablet computer or other types of computing devices. The device 100 includes a processor 102, a memory 104, a storage 106, one or more input devices 108, and one or more output devices 110. The device 100 can also optionally include an input driver 112 and an output driver 114. It is understood that the device 100 can include additional components not shown in FIG. 1.

In various alternatives, the processor 102 includes a central processing unit (CPU), a graphics processing unit (GPU), a CPU and GPU located on the same die, or one or more processor cores, wherein each processor core can be a CPU or a GPU. In various alternatives, the memory 104 is located on the same die as the processor 102, or is located separately from the processor 102. The memory 104 includes a volatile or non-volatile memory, for example, random access memory (RAM), dynamic RAM, or a cache.

The storage 106 includes a fixed or removable storage, for example, a hard disk drive, a solid-state drive, an optical disk, or a flash drive. The input devices 108 include, without limitation, a keyboard, a keypad, a touch screen, a touch pad, a detector, a microphone, an accelerometer, a gyroscope, a biometric scanner, or a network connection (e.g., a wireless local area network card for transmission and/or reception of wireless IEEE 802 signals). The output devices 110 include, without limitation, a display device 118, a display connector/ interface (e.g., an HDMI or DisplayPort connector or inter- face for connecting to an HDMI or Display Port compliant device), a speaker, a printer, a haptic feedback device, one or more lights, an antenna, or a network connection (e.g., a wireless local area network card for transmission and/or reception of wireless IEEE 802 signals).

The input driver 112 communicates with the processor 102 and the input devices 108, and permits the processor 102 to receive input from the input devices 108. The output driver 114 communicates with the processor 102 and the output devices 110, and permits the processor 102 to send output to the output devices 110. It is noted that the input driver 112 and the output driver 114 are optional compo- nents, and that the device 100 will operate in the same manner if the input driver 112 and the output driver 114 are not present. The output driver 114 includes an accelerated processing device ("APD") 116 which is coupled to a display device 118. The APD accepts compute commands and graphics rendering commands from processor 102, processes those compute and graphics rendering commands, and provides pixel output to display device 118 for display. As described in further detail below, the APD 116 includes one or more parallel processing units to perform computa- tions in accordance with a single-instruction-multiple-data ("SIMD") paradigm. Thus, although various functionality is described herein as being performed by or in conjunction with the APD 116, in various alternatives, the functionality described as being performed by the APD 116 is additionally or alternatively performed by other computing devices hav- ing similar capabilities that are not driven by a host proces- sor (e.g., processor 102) and provides graphical output to a display device 118. For example, it is contemplated that any processing system that performs processing tasks in accor- dance with a SIMD paradigm may perform the functionality described herein. Alternatively, it is contemplated that com- puting systems that do not perform processing tasks in accordance with a SIMD paradigm can also perform the functionality described herein.

Figure 2:
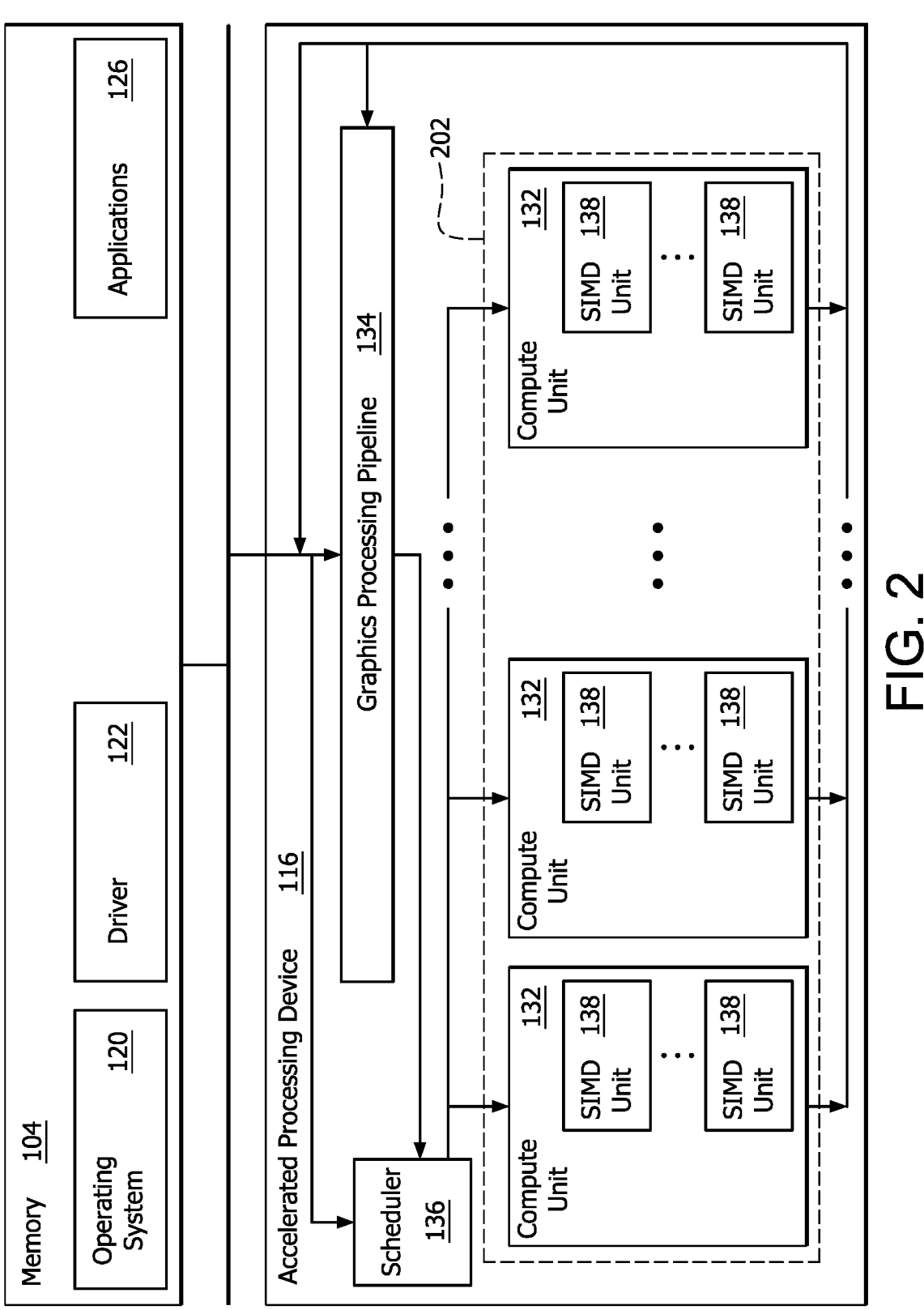
FIG. 2 is a block diagram of the device of FIG. 1, illustrating additional detail.

FIG. 2 is a block diagram of aspects of device 100, illustrating additional details related to execution of pro- cessing tasks on the APD 116. The processor 102 maintains, in system memory 104, one or more control logic modules for execution by the processor 102. The control logic modules include an operating system 120, a kernel mode driver 122, and applications 126. These control logic modules control various features of the operation of the proces- sor 102 and the APD 116. For example, the operating system 120 directly communicates with hardware and provides an interface to the hardware for other software executing on the processor 102. The kernel mode driver 122 controls opera- tion of the APD 116 by, for example, providing an applica- tion programming interface ("API") to software (e.g., appli- cations 126) executing on the processor 102 to access various functionality of the APD 116. The kernel mode driver 122 also includes a just-in-time compiler that com- piles programs for execution by processing components (such as the SIMD units 138 discussed in further detail below) of the APD 116.

The APD 116 executes commands and programs for selected functions, such as graphics operations and non- graphics operations that are or can be suited for parallel processing. The APD 116 can be used for executing graphics pipeline operations such as pixel operations, geometric computations, and rendering an image to display device 118 based on commands received from the processor 102. The APD 116 also executes compute processing operations that are not directly related to graphics operations, such as operations related to video, physics simulations, computa- tional fluid dynamics, or other tasks, based on commands received from the processor 102.

The APD 116 includes compute units 132 that include one or more SIMD units 138 that perform operations at the request of the processor 102 in a parallel manner according to a SIMD paradigm. The SIMD paradigm is one in which multiple processing elements share a single program control flow unit and program counter and thus execute the same program but are able to execute that program with or using different data. In one example, each SIMD unit 138 includes sixteen lanes, where each lane executes the same instruction at the same time as the other lanes in the SIMD unit 138 but can execute that instruction with different data. Lanes can be switched off with predication if not all lanes need to execute a given instruction. Predication can also be used to execute programs with divergent control flow. More specifically, for programs with conditional branches or other instructions where control flow is based on calculations performed by an individual lane, predication of lanes corresponding to con- trol flow paths not currently being executed, and serial execution of different control flow paths allows for arbitrary control flow.

The basic unit of execution in compute units 132 is a work-item. Each work-item represents a single instantiation of a program that is to be executed in parallel in a particular lane. Work-items can be executed simultaneously as a "wavefront" on a single SIMD processing unit 138. One or more wavefronts are included in a "work group," which includes a collection of work-items designated to execute the same program. A work group can be executed by executing each of the wavefronts that make up the work group. In alternatives, the wavefronts are executed sequen- tially on a single SIMD unit 138 or partially or fully in parallel on different SIMD units 138. Wavefronts can be thought of as the largest collection of work-items that can be executed simultaneously on a single SIMD unit 138. Thus, if commands received from the processor 102 indicate that a particular program is to be parallelized to such a degree that the program cannot execute on a single SIMD unit 138 simultaneously, then that program is broken up into wave- fronts which are parallelized on two or more SIMD units 138 or serialized on the same SIMD unit 138 (or both paral- lelized and serialized as needed). A scheduler 136 performs operations related to scheduling various wavefronts on different compute units 132 and SIMD units 138.

The parallelism afforded by the compute units 132 is suitable for graphics related operations such as pixel value calculations, vertex transformations, and other graphics operations and non-graphics operations (sometimes known as "compute" operations). Thus, in some instances, a graphics pipeline 134, which accepts graphics processing commands from the processor 102, provides computation tasks to the compute units 132 for execution in parallel.

The compute units 132 are also used to perform computation tasks not related to graphics or not performed as part of the "normal" operation of a graphics pipeline 134 (e.g., custom operations performed to supplement processing performed for operation of the graphics pipeline 134). An application 126 or other software executing on the processor 102 transmits programs that define such computation tasks to the APD 116 for execution.

Figure 3:
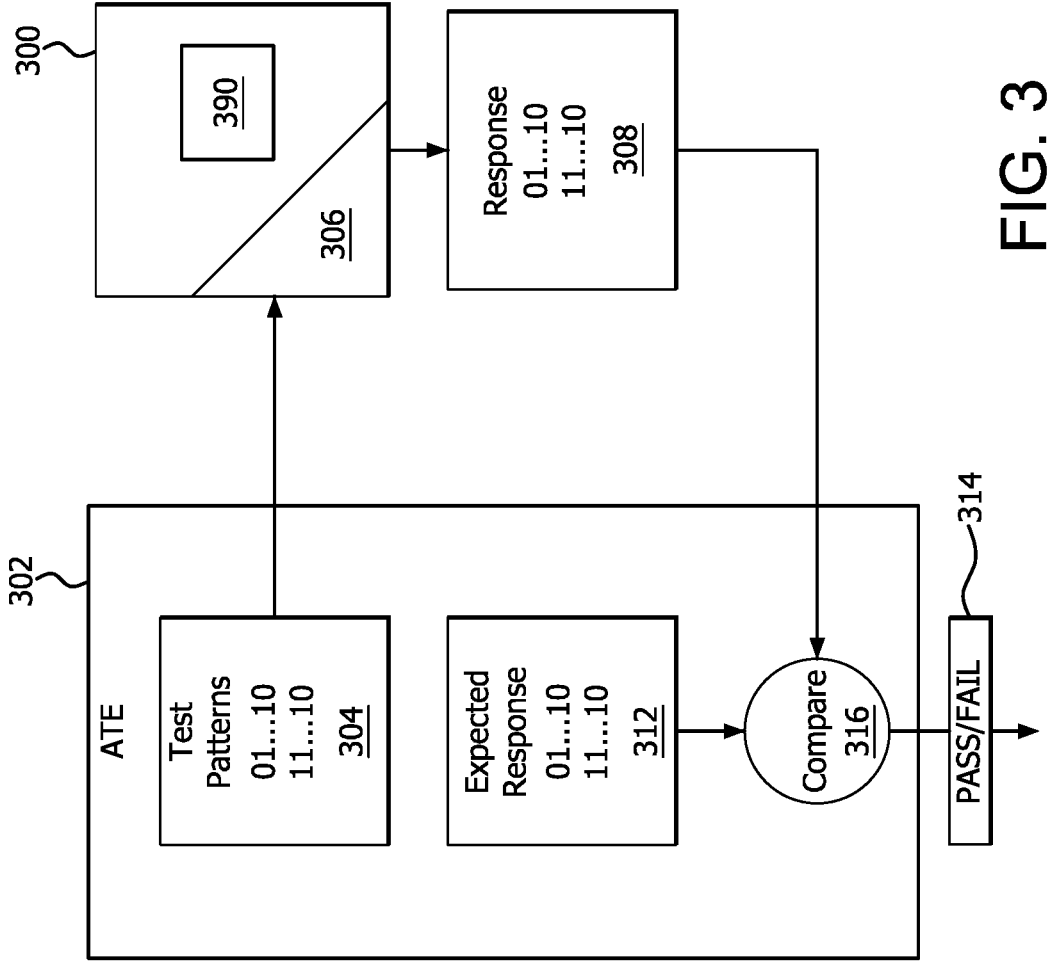
FIG. 3 is a block diagram of an example automatic test scenario based on ATE testing.

FIG. 3 is a block diagram of an example automatic test scenario where an IC 300 is automatically tested by ATE 302 through a communications interface 306. In this example, IC 300 is a system-on-a-chip (SoC), however any suitable IC or other circuitry is testable in other implementations. For example, IC 300 may be or include a processor such as processor 102 as shown and described with respect to FIGS. 1 and 2, or may be or include an APD as shown and described with respect to FIGS. 1 and 2. Communications interface 306 includes any suitable communications interface, such as PCIe or USB. In various implementations, the test is a functional test to determine whether there are any manufacturing defects or other defects. For example, in some implementations, the test is a structural or scan test.

ATE 302 inputs one or more test patterns 304 to communications interface 306 of IC 300, and test circuitry of IC 300 (e.g., a microcontroller) tests circuitry 390 of the IC 300 (e.g., a plurality of tiles) with one or more of the test patterns 304 to generate a response 308. In some implementations, testing of circuitry 390 includes stimulating the inputs of circuitry 390 based on one or more of the test patterns 304 to generate response 308 as an output of circuitry 390.

IC 300 returns response 308 to ATE 302 through communications interface 306. Comparison circuitry 310 of ATE 302 compares response 308 with an expected response 312 (e.g., stored on ATE 302 or any other suitable location) to determine whether IC 300 is defective. In this example, ATE 302 outputs a Pass/Fail signal 314. In other implementations, other outputs are possible (e.g., an indication of a failure cause, etc.)

Figure 4:
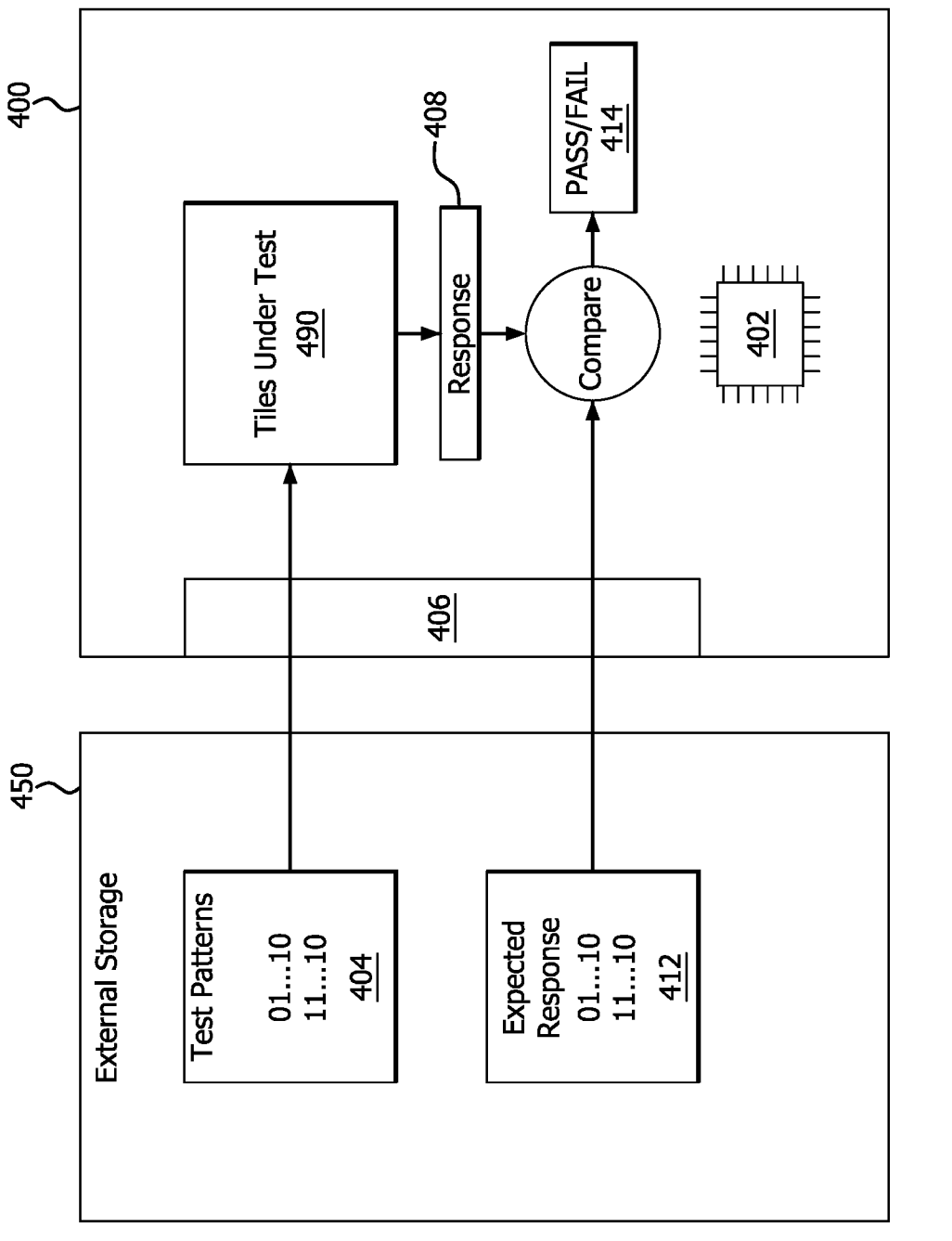
FIG. 4 is a block diagram of another example automatic test scenario based on on-device testing.

FIG. 4 is a block diagram of another example automatic test scenario where an IC 400 conducts automatic testing using an onboard microcontroller 402 which reads test patterns 404 and an expected response 412 through a communications interface 406 from an external storage 450.

In this example, IC 400 is a system-on-a-chip (SoC), however any suitable IC or other circuitry is testable in other implementations. For example, IC 400 may be or include a processor such as processor 102 as shown and described with respect to FIGS. 1 and 2, or may be or include an APD as shown and described with respect to FIGS. 1 and 2. Communications interface 406 includes any suitable communications interface, such as PCIe or USB. External storage 450 includes any suitable memory, storage, extensible medium, cloud storage, or other device capable of storing data and communicating data to IC 400.

Microcontroller 402 reads one or more test patterns 404 from external storage 450 through communications interface 406 of IC 400, and tests the circuitry 490 for test (e.g., a plurality of tiles) on IC 400 with one or more of the test patterns 404 to generate a response 408.

Microcontroller 402 also reads an expected response 412 (e.g., stored on external storage 450 or any other suitable location) through communications interface 406, and compares expected response 412 with response 408 to determine whether IC 400 is defective. It is noted that the test patterns 404 and expected response 412 are too large to be stored entirely in the registers of microcontroller 402, but rather, portions of the test patterns 404 and expected response 412 are read from external storage 450, e.g., as needed during testing.

In this example, microcontroller 402 sets a Pass/Fail register 414 indicating whether IC 400 is defective. In other implementations, other outputs are possible (e.g., an indication of a failure cause, etc.) or other signals are possible (e.g., output via communications interface 406, etc.)

In both the scenario of FIG. 3, and the scenario of FIG. 4, the communications interface 306 or communications interface 406 is not tested and is not testable because these interfaces are in use during the test procedure (e.g., due to as-needed reads of test patterns 404 and expected response 412 from external storage 450), and are isolated from the test procedure, in some implementations. In some implementations, isolation includes circuitry which prevents outputs of the communications interface from interfering with other circuitry that is under test (e.g., inputs of the circuitry under test that are set to specific values by the test). In the scenario of FIG. 3, ATE 302 is directly supplying test patterns 304 to IC 300 for testing. In the scenario of FIG. 4, microcontroller 402 reads one or more test patterns 404 and expected response 412 from external storage 450 through communications interface 406 for testing. It is noted that typically the IC under test does not include a single large enough memory to store the test data, which is relatively large (e.g., on the order of gigabits of data) in some implementations.

Figure 5:
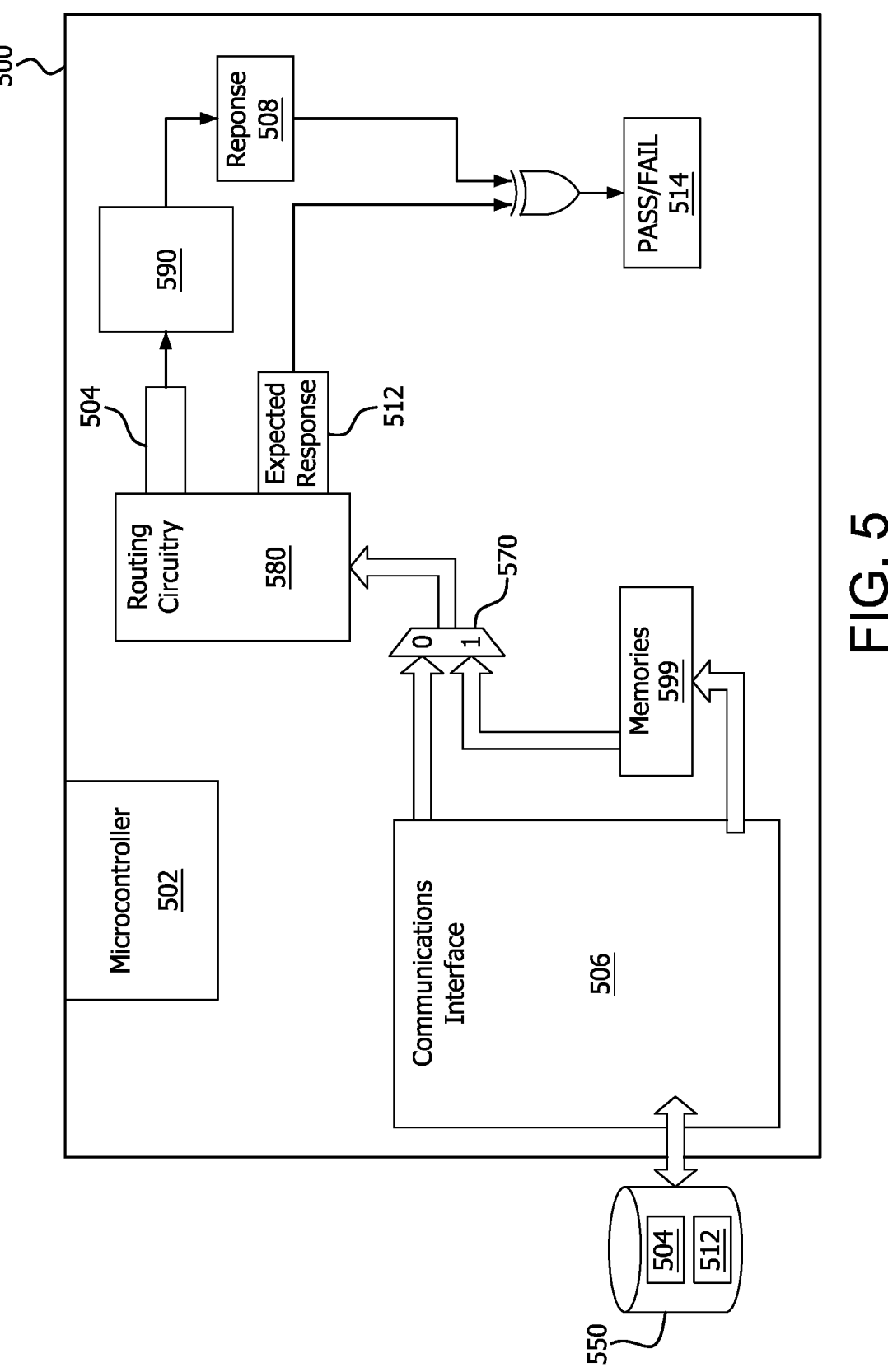
FIG. 5 is a block diagram of another example automatic test scenario based on on-device testing.

FIG. 5 is a block diagram of another example automatic test scenario where an IC 500 conducts automatic testing using an onboard microcontroller 502 which reads test patterns 504 and an expected response 512 through a communications interface 506 from an external storage 550.

In this example, IC 500 is a system-on-a-chip (SoC), however any suitable IC is used in other implementations. For example, IC 500 may be or include a processor such as processor 102 as shown and described with respect to FIGS. 1 and 2, or may be or include an APD as shown and described with respect to FIGS. 1 and 2. Communications interface 506 includes any suitable communications interface, such as PCIe or USB. External storage 550 includes any suitable memory, storage, extensible medium, cloud storage, or other device capable of storing data and communicating data to IC 500.

Microcontroller 502 reads one or more test patterns 504 from external storage 550 through communications interface 506 of IC 500, and tests the circuitry 590 (e.g., a plurality of tiles) with one or more of the test patterns 504 to generate a response 508. Microcontroller 502 routes one or more test patterns 504 from the communications interface 506 to circuitry 590 via multiplexing circuitry 570, which selects the communications interface 506 as the source for the test patterns, and routing circuitry 580 (e.g., a scan input router) which communicates the test patterns to the various parts of the circuitry 590 for test (e.g., different tiles, etc.)

It is noted that the communications interface 506 is isolated from the test, and does not receive any of the test patterns 504 or contribute to the response 508 at this time.

Microcontroller 502 also reads an expected response 512 (e.g., stored on external storage 550 or any other suitable location) through communications interface 506, and compares expected response 512 with response 508 to determine whether IC 500 is defective. Microcontroller 502 routes the expected response 512 from the communications interface 506 to circuitry 590 via multiplexing circuitry 570, which selects the communications interface 506 as the source for the expected response, and routing circuitry 580.

In this example, microcontroller 502 sets a Pass/Fail register 514 indicating whether IC 500 is defective. In other implementations, other outputs are possible (e.g., an indication of a failure cause, etc.) or other signals are possible (e.g., output via communications interface 506, etc.)

After this is complete, microcontroller 502 also reads one or more test patterns 504 and expected response 512 from external storage 550 through communications interface 506 of IC 500 and writes test patterns 504 into a pool of memories 599. Pool of memories 599 is described in further detail herein. In some implementations, a pool of memories refers to a number of memories that are used together to store data, in this context. For example, in some implementations, a pool of memories includes a number of memories that store data across the memories, e.g., in series.

After writing test patterns 504 into pool of memories 599 is complete, microcontroller 502 reads one or more test patterns 504 from pool of memories 599 and tests the communications interface 506 circuitry for test with one or more of the test patterns 504 to generate a response 508. It is noted that from the perspective of the example shown, communications interface 506 is part of circuitry 590, now no longer isolated from the test. In some implementations, the circuitry that has already been tested is isolated from test at this point.

Microcontroller 502 routes the one or more test patterns 504 from the communications interface 506 to communications interface 506 circuitry via multiplexing circuitry 570, which selects the memories 599 as the source for the test patterns, and routing circuitry 580 which communicates the test patterns to the communications interface 506 circuitry.

Microcontroller 502 also reads an expected response 512 from pool of memories 599 and compares expected response 512 with response 508 to determine whether IC 500 is defective. Microcontroller 502 routes the expected response 512 from the pool of memories 599 to circuitry 590 via multiplexing circuitry 570, which selects the pool of memories 599 as the source for the expected response, and routing circuitry 580.

In this example, microcontroller 502 sets a Pass/Fail register 514 indicating whether IC 500 is defective. In other implementations, other outputs are possible (e.g., an indication of a failure cause, etc.) or other signals are possible (e.g., output via communications interface 506, etc.)

FIG. 6 is a flow chart illustrating an example method 600 for automatic test of an IC using an onboard microcontroller which reads test patterns and an expected response through a communications interface from an external storage. Method 600 may be used, for example, with the example test scenario shown and described with respect to FIG. 4. Method 600 is illustrative, however other implementations include additional elements, omit elements, and/or perform elements in a different order.

The microcontroller is brought out of reset by a cold boot or another suitable signal in 602. The microcontroller initiates the communications interface (e.g., PCIe, other host-to-device interface, or other communications interface) and begins reading test patterns and expected response data from the external storage (or other storage) in 604. The microcontroller isolates the communications interface circuitry and stimulates the circuitry for test with the test patterns in 606. The microcontroller compares the output with the expected response data for the circuitry under test (i.e., excluding the communications interface circuitry) in 608. The microcontroller completes the test and continues with other tasks (e.g., boot processes, memory repair, bringing circuitry out of reset, etc.) in 610.

It is noted that following method 600, the communications interface circuitry remains untested.

FIG. 7 is a flow chart illustrating an example method 700 for automatic test of an IC using an onboard microcontroller which reads test patterns and an expected response through a communications interface from an external storage. Method 700 may be used, for example, with the example test scenario shown and described with respect to FIG. 5. Method 700 is illustrative, however other implementations include additional elements, omit elements, and/or perform elements in a different order.

The microcontroller is brought out of reset by a cold boot or another suitable signal in 702. The microcontroller initiates the communications interface (e.g., PCIe) and begins reading test patterns and expected response data for all circuitry to be tested, other than the communications interface, from the external storage in 704. The microcontroller isolates the communications interface circuitry and stimulates the circuitry for test with the test patterns in 706. The microcontroller compares the output with the expected response data for the circuitry under test (i.e., excluding the communications interface circuitry) in 708.

The microcontroller begins reading test patterns and expected response data for the communications interface from the external storage and writes these test patterns to a pool of memories (further described herein) in 710. The microcontroller isolates the communications interface circuitry from the external storage and from the other circuitry (e.g., other tiles) and stimulates the communications interface circuitry with the stored test patterns in 712. The microcontroller compares the output with the expected response data for the communications interface circuitry (i.e., excluding the other circuitry) in 714.

The microcontroller completes the testing at 716, removes isolation of the communications circuitry, and continues with other tasks (e.g., boot processes, memory repair, bringing circuitry out of reset, etc.) in 718.

It is noted that following method 700, the communications interface circuitry has been tested.

FIGS. 8-18 describe circuitry and methodology for pooling memory on an IC that is to be tested, e.g., in the manner shown and described with respect to FIGS. 5 and 7. In this way, in some implementations, a number of smaller memories, buffers, and/or other storage devices onboard the IC are combined or "pooled" in order to store test data for testing the communications interface (and/or any other circuitry on the IC, e.g., which may be desired to be isolated). It is noted that the circuitry and/or methodology for pooling memory shown and described with respect to FIGS. 8-18 is usable for any other suitable purpose, e.g., other than testing the IC. FIGS. 8-18 are implementable using any suitable circuitry, e.g., as shown and described with respect to FIGS. 1 and 2.

Figure 8:
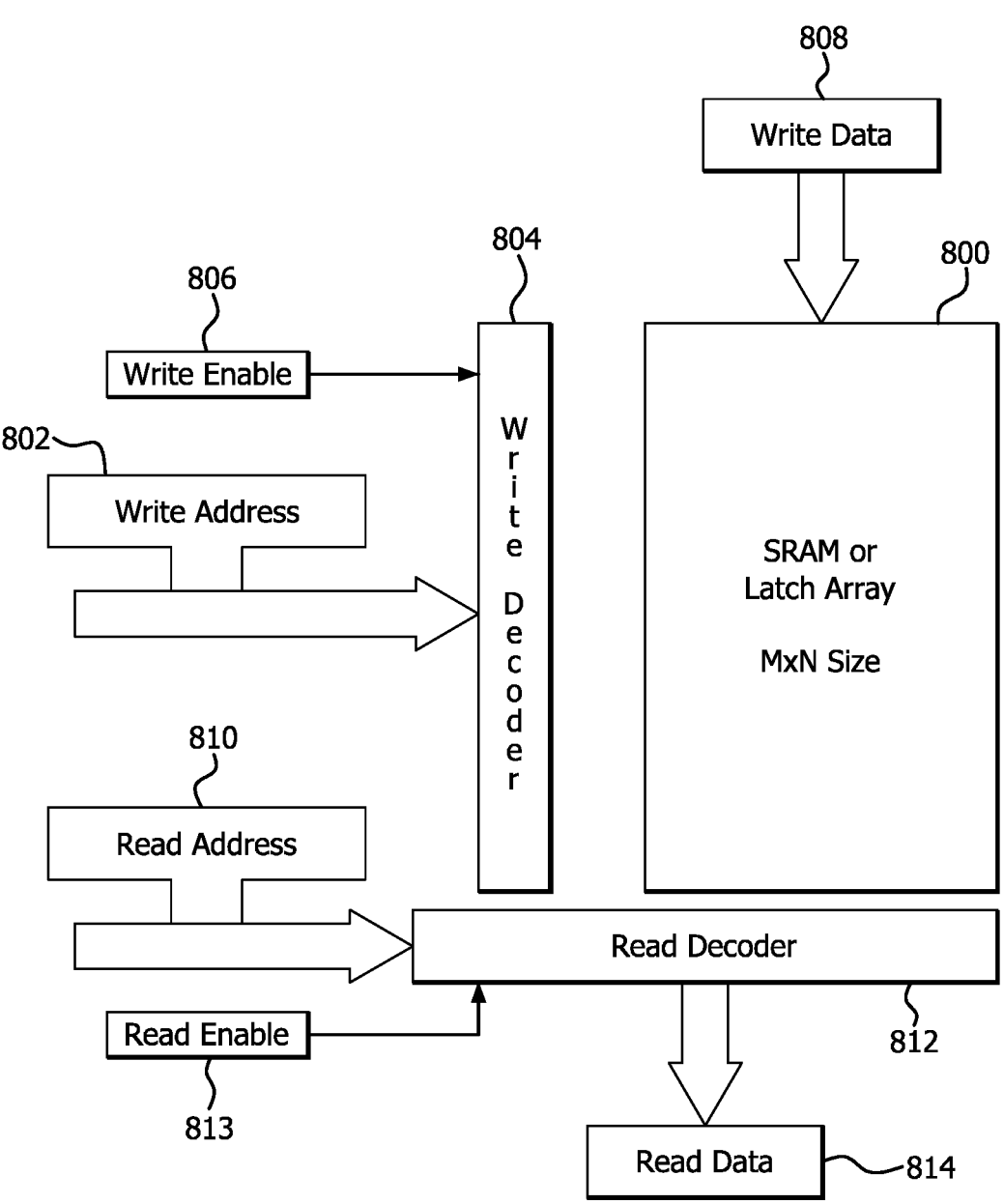
FIG. 8 is a block diagram illustrating an example memory.

FIG. 8 is a block diagram illustrating an example memory 800. Memory 800 is a SRAM, latch array, or any other suitable memory, buffer, or storage device. In this example, each word of memory 800 is N bits wide, and memory 800 is M words long (i.e., memory 800 is M×N bits in size).

In order to write data into memory 800, a write address 802 is presented to write decoder 804, which is enabled by write enable signal 806. At write enable signal 806, write data 808 is written to the memory 800 at write address 802.

In order to read data from memory 800, a read address 810 is presented to read decoder 812, which is enabled by read enable signal 813. At read enable signal 813, read data 814 is read from the memory 800 at read address 810.

Figure 9:
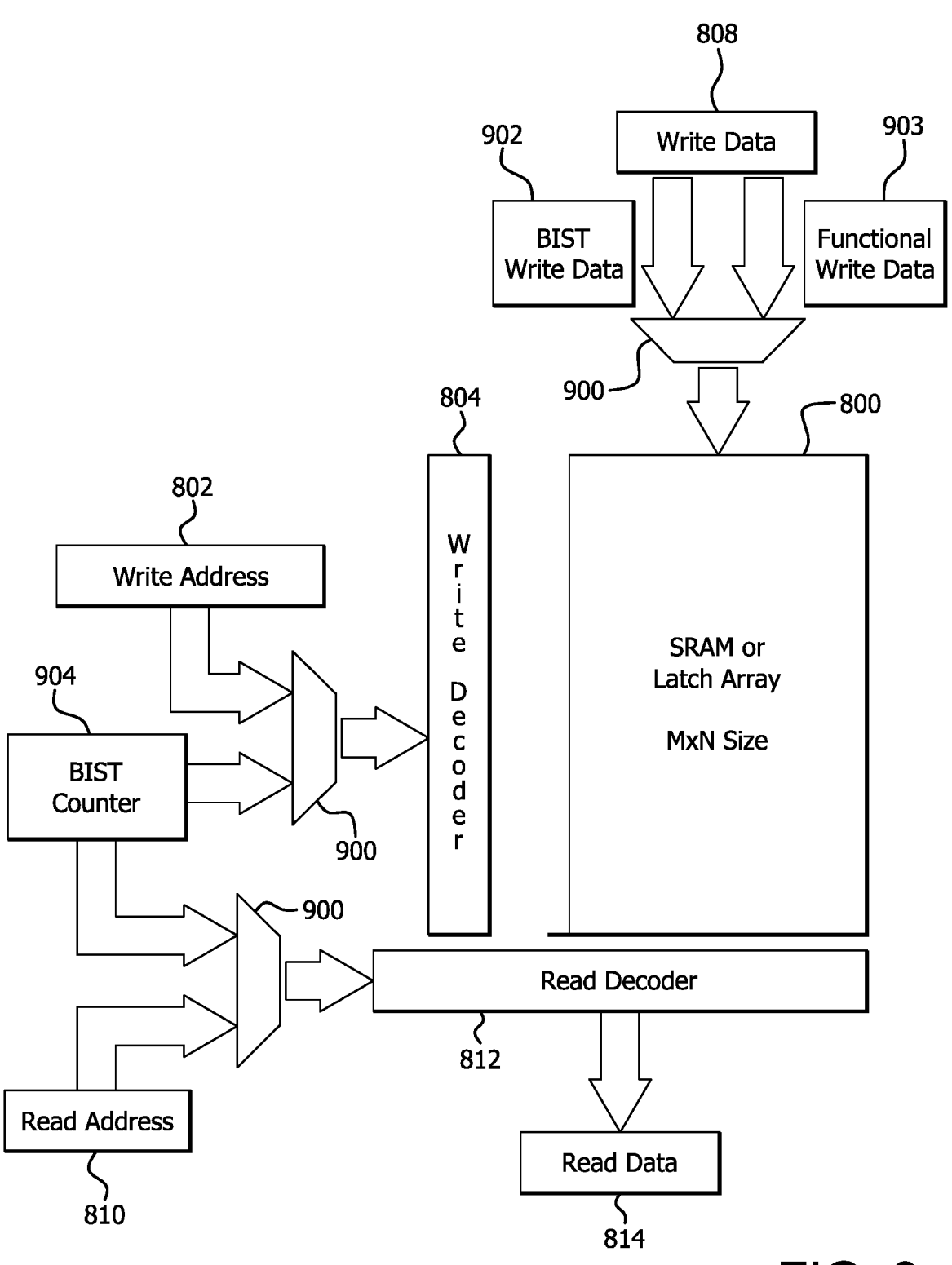
FIG. 9 is a block diagram illustrating an example memory with additional components for conducting a built-in-self-test (BIST)

FIG. 9 is a block diagram illustrating example memory 800 with additional components for conducting a built-in-self-test (BIST). In some implementations, any suitable BIST components are used. In the example of FIG. 9, multiplexing circuitry 900 selects the source of write data 808 as either functional write data 903 (e.g., data from circuitry which writes data to memory 800 during typical operation) or BIST write data 902, and selects the source of the write address 802 and read address 810 as either the source of functional write data 903, or an address provided by a BIST counter 904. The BIST circuitry provides functionality for inputting test patterns on the memory 800 for testing (e.g., as described above.)

Figure 10:
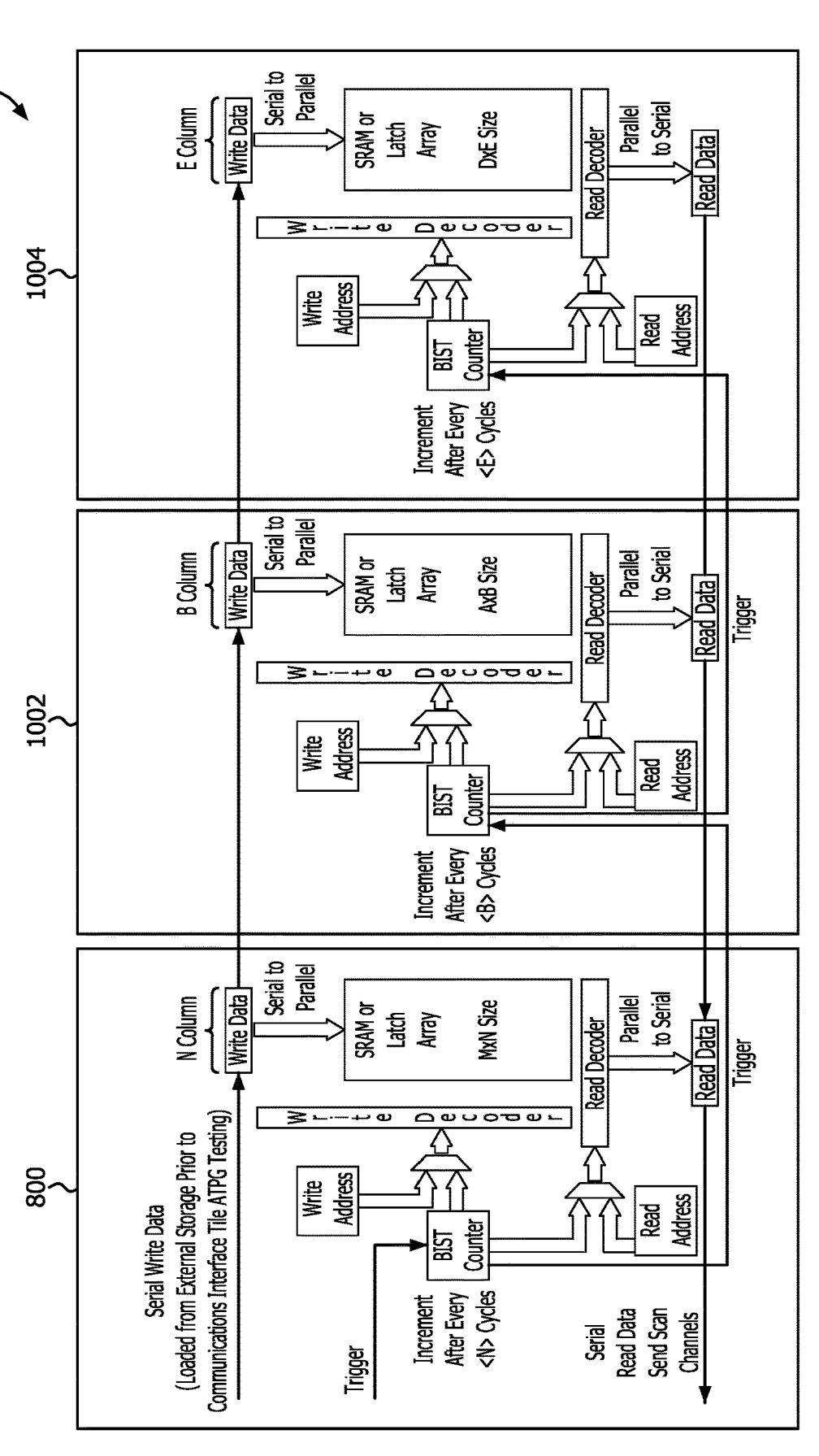
FIG. 10 is a block diagram illustrating an example memory pool.

FIG. 10 is a block diagram illustrating example memory pool 1000, showing memory 800 and its associated BIST circuitry, as well as memory 1002 and its associated BIST circuitry, and memory 1004 and its associated BIST circuitry. Memory 1002 and 1004 and their associated BIST circuitry are substantially similar to memory 800 except that they may have a different width and/or size. In this example, memory 1002 has a word width of B, and is A words long (i.e., is B×A in size), and memory 1004 has a word width of E, and is D words long (i.e., is E×D in size).

The BIST circuitry of memories 800, 1002, and 1004 are in communication such that the saturation of the counter of memory 800 triggers the counter of 1002, and the saturation of the counter of memory 1002 triggers the counter of 1004, as further described herein. The combined BIST circuitry facilitates pooling or combination of several memories, e.g., for use in storing a large ATPG data set (or other data, in other implementations).

Three memories and their associated BIST circuitry are shown for the sake of example, however it is noted that any suitable number of memories are usable together in some implementations. In this example, each of the memories has a different width, and a different total size, however it is noted that in some implementations, some or all of the memories may have the same width and/or the same size.

FIGS. 11-14 are block diagrams illustrating write operations where data (e.g., test data) is written to the memory pool 1000 (e.g., from an external storage or host. In some implementations, data is written to the memory pool by configuring the BIST circuitry of each of memory 800, memory 1002, and memory 1004 to receive data In some implementations, the BIST circuitry of each of memory 800, memory 1002, and memory 1004 is configured to store data, e.g., as a memory pool. In some implementations, the memories of memory pool 1000 are configured to be written sequentially, e.g., as described with respect to FIGS. 11-14.

Figure 11:
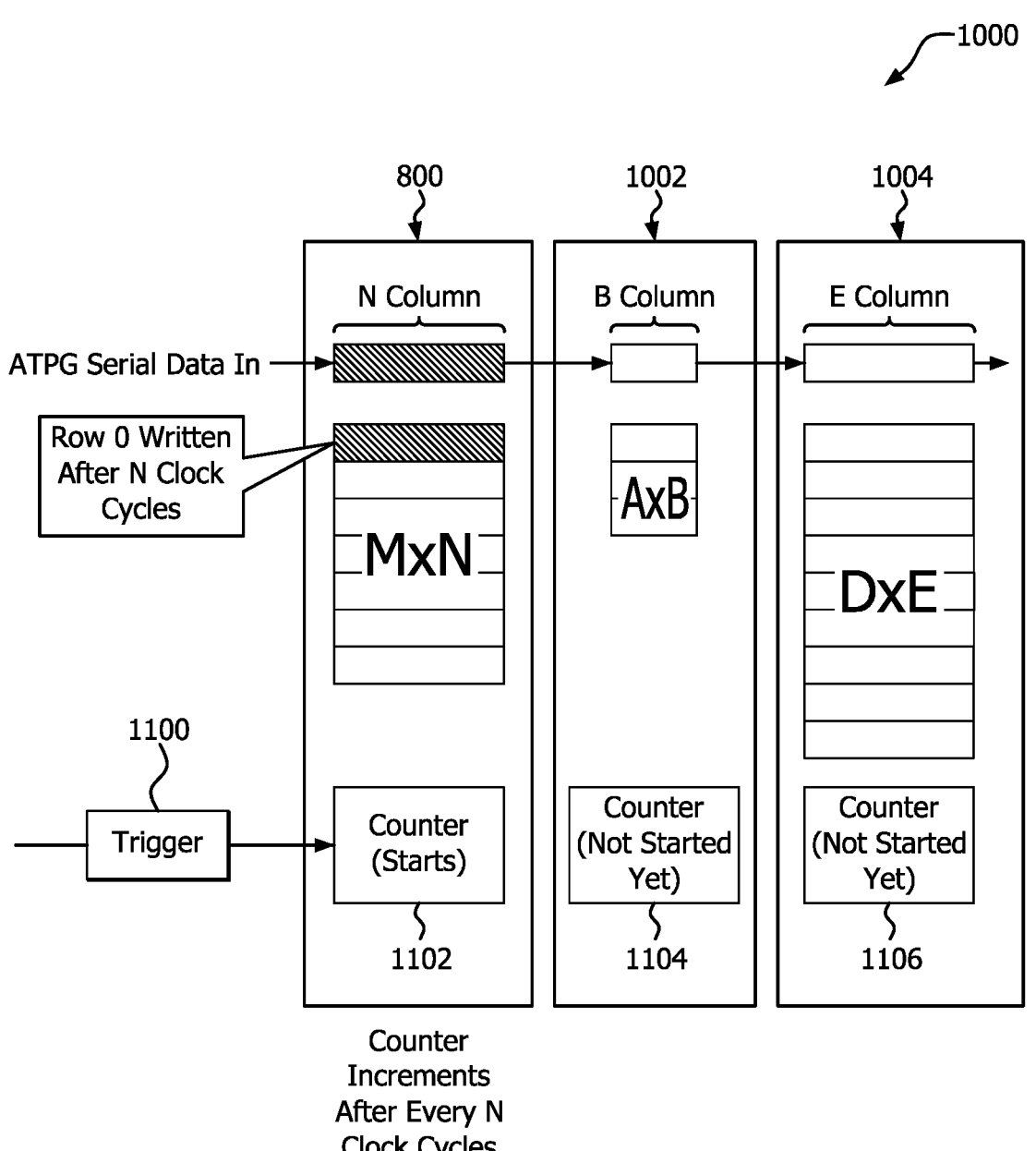
FIG. 11 is a block diagram illustrating write operations where write data fills the memory pool shown and described with respect to FIG. 10.

FIG. 11 is a block diagram illustrating example write operation of example memory pool 1000 for the first N clock cycles. Writing to memory pool 1000 begins based on any suitable trigger 1100, which starts the BIST counter for the first memory in memory pool 1000. In some implementations, the counter indicates the row of memory currently being written.

In this example, BIST counter 1102 for memory 800 is the first memory in memory pool 1000. At each clock cycle, a column of data is written to the first row (row 0) of memory 800. It is noted that in some implementations, other amounts of data are written per-clock-cycle (e.g., multiple columns, parts of a column, one or more bytes, or portions of bytes of data, etc.). In this example, row 0 of memory 800 is fully written after N clock cycles. After N clock cycles, BIST counter 1102 increments (in this example, to a value of 1).

Figure 12:
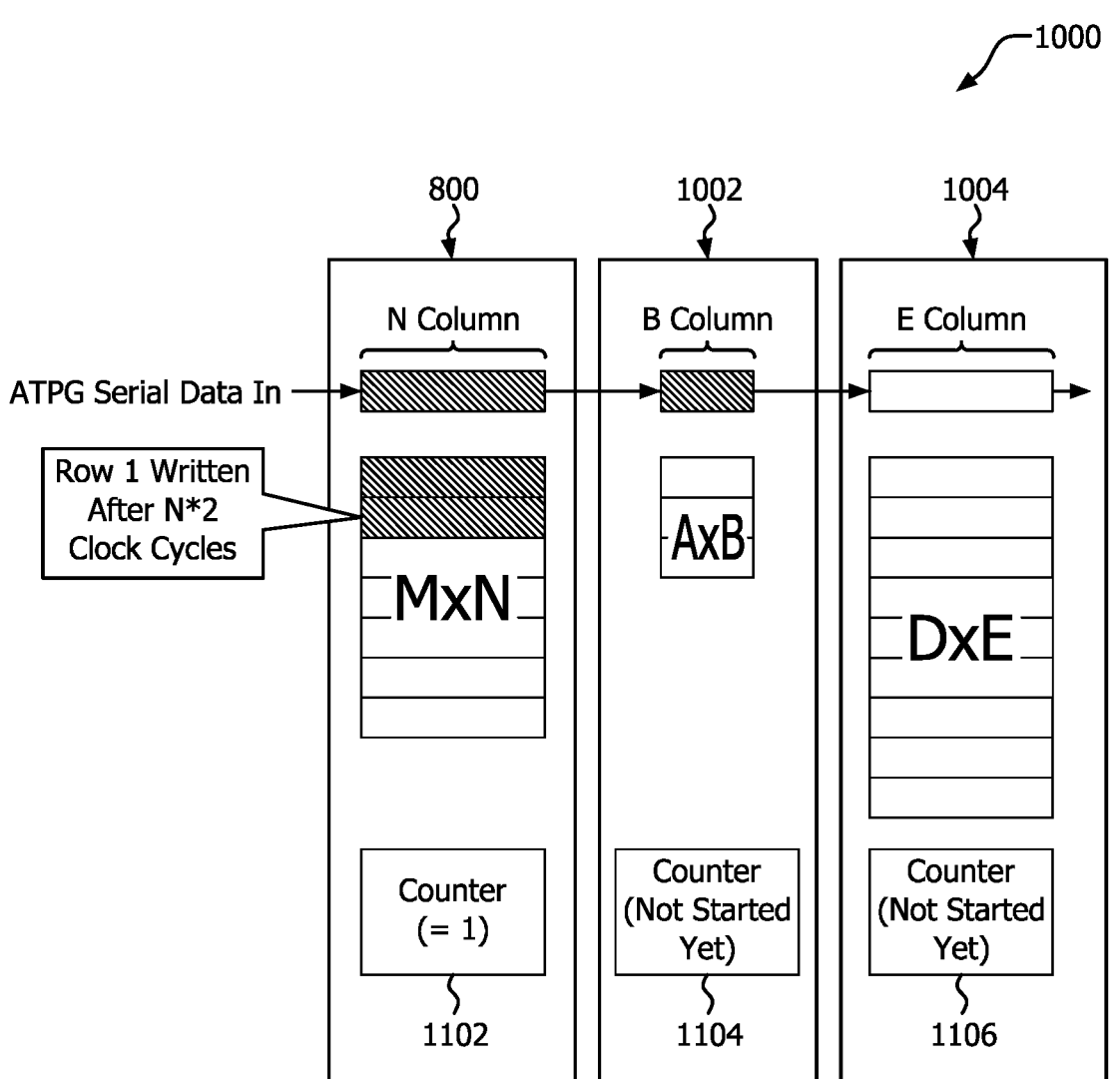
FIG. 12 is another block diagram illustrating write operations where write data fills the memory pool shown and described with respect to FIG. 10.

FIG. 12 is a block diagram illustrating example write operation of example memory pool 1000 for the second N clock cycles (i.e., clock cycle N+1 through clock cycle N*2). At each clock cycle, a column of data is written to the second row (row 1) of memory 800. Row 1 of memory 800 is fully written after N*2 clock cycles. After N*2 clock cycles, BIST counter 1102 increments (in this example, to a value of 2). Each row of memory 800 is written in this way until counter 1102 saturates (in this case, at a value of M).

Figure 13:
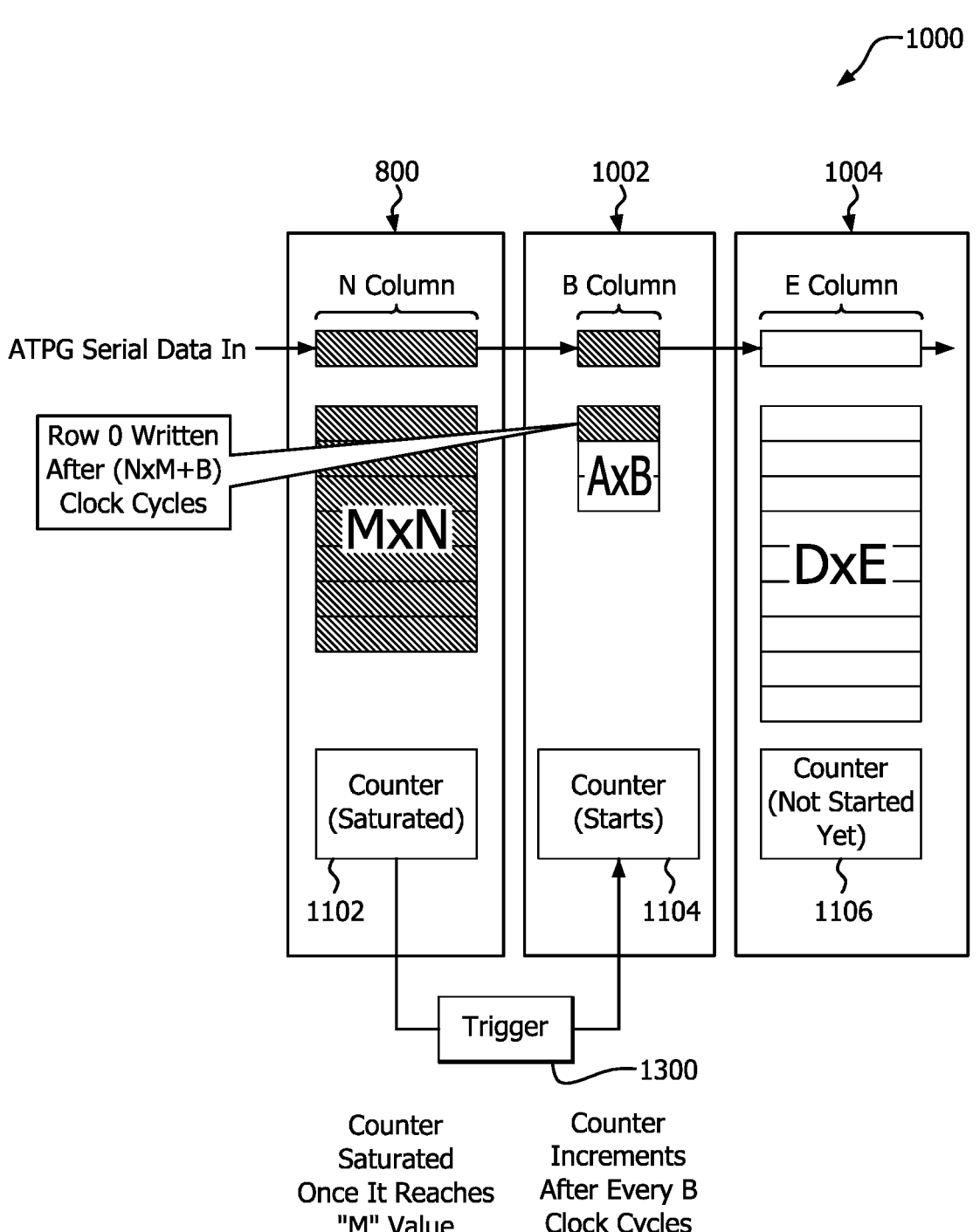
FIG. 13 is another block diagram illustrating write operations where write data fills the memory pool shown and described with respect to FIG. 10.

FIG. 13 is a block diagram illustrating example write operation of example memory pool 1000 for the first B clock cycles after memory 800 is fully written (i.e., clock cycle N*M+1 through clock cycle N*M+B). The saturation of counter 1102 results in a trigger 1300 for the start of the BIST counter for the next memory of memory pool 1000 (in this example, memory 1002).

At each clock cycle, a column of data is written to the first row (row 0) of memory 1002. Row 0 of memory 1002 is fully written after B clock cycles from the beginning of write to memory 1002 (or, N*M+B clock cycles from the beginning of write to memory pool 1000) after which, BIST counter 1104 increments (in this example, to a value of 1). Operation proceeds whereby row 1 of memory 1002 is fully written after B*2 clock cycles from the beginning of write to memory 1002, and so forth, and each row of memory 1002 is written in this way until counter 1104 saturates (in this case, at a value of A).

Figure 14:
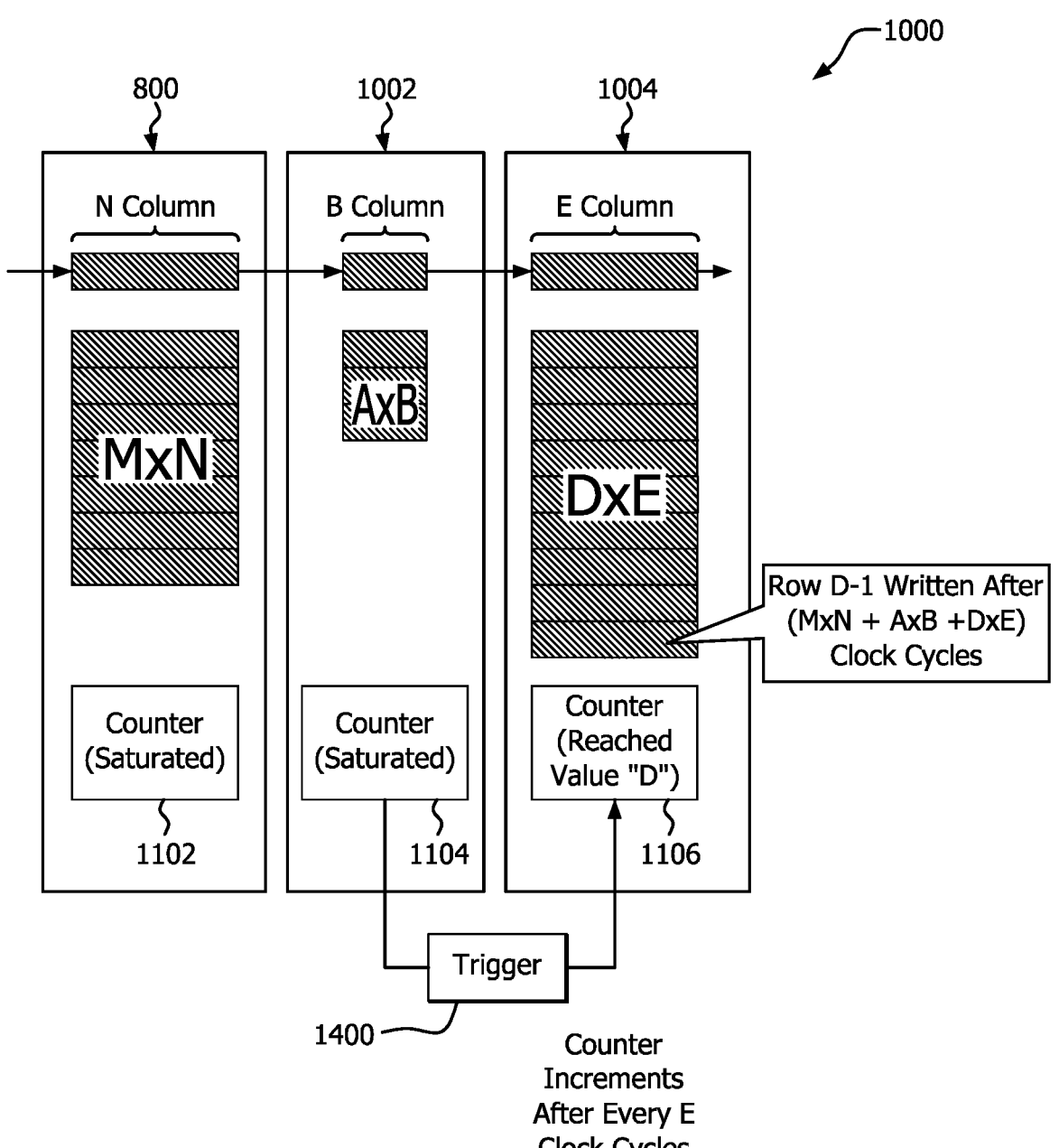
FIG. 14 is another block diagram illustrating write operations where write data fills the memory pool shown and described with respect to FIG. 10.

FIG. 14 is a block diagram illustrating example write operation of example memory pool 1000 after N+B+E clock cycles from the beginning of write to memory pool 1000. The saturation of counter 1104 results in a trigger 1400 of the start of the BIST counter for the next memory of memory pool 1000 (in this example, memory 1004). Operation proceeds whereby each row of memory 1004 is fully written after each subsequent E clock cycles from the beginning of write to memory 1004, until counter 1106 saturates (in this case, at a value of E). At this point, memory pool 1000 has been fully written.

FIGS. 15-18 are block diagrams illustrating read operations where the test data is read from the memory pool 1000. In some implementations, data is read from the memory pool by an on-chip microcontroller or other suitable circuitry. In some implementations, the BIST circuitry of each of memory 800, memory 1002, and memory 1004 is configured to be read, e.g., as a memory pool. In some implementations, the memories of memory pool 1000 are configured to be read sequentially, e.g., as described with respect to FIGS. 15-18.

Figure 15:
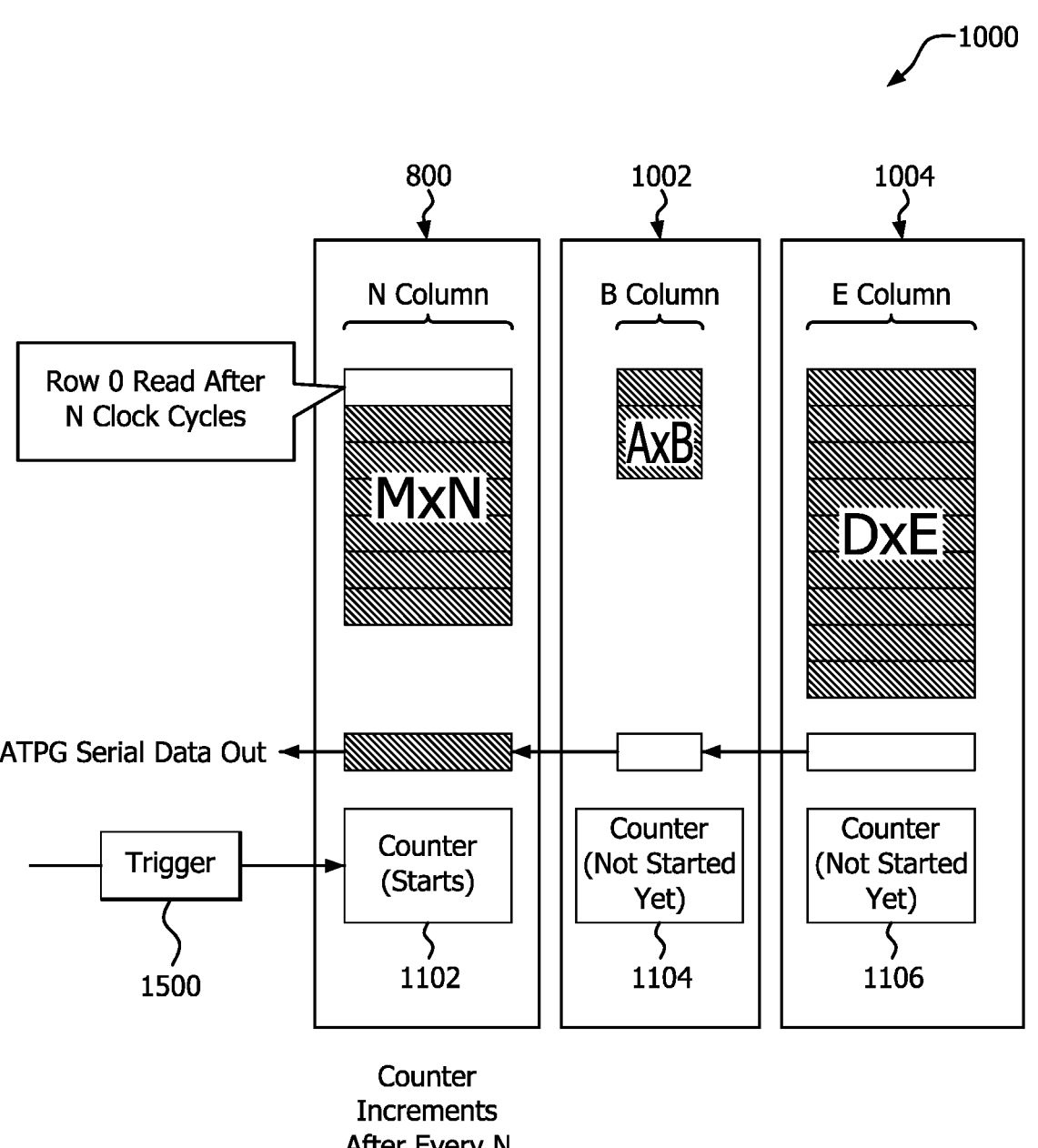
FIG. 15 is a block diagram illustrating read operations where read data is read from the memory pool shown and described with respect to FIG. 10.

FIG. 15 is a block diagram illustrating example read operation of example memory pool 1000 for the first N clock cycles. Reading from memory pool 1000 begins based on any suitable trigger 1500, which starts the BIST counter for the first memory in memory pool 1000. In some implementations, the counter indicates the row of memory currently being read.

In this example, BIST counter 1102 for memory 800 is the first memory in memory pool 1000. At each clock cycle, a column of data is read from the first row (row 0) of memory 800. It is noted that in some implementations, other amounts of data are read per-clock-cycle (e.g., multiple columns, parts of a column, one or more bytes, or portions of bytes of data, etc.). In this example, row 0 of memory 800 is fully read after N clock cycles. After N clock cycles, BIST counter 1102 increments (in this example, to a value of 1).

Figure 16:
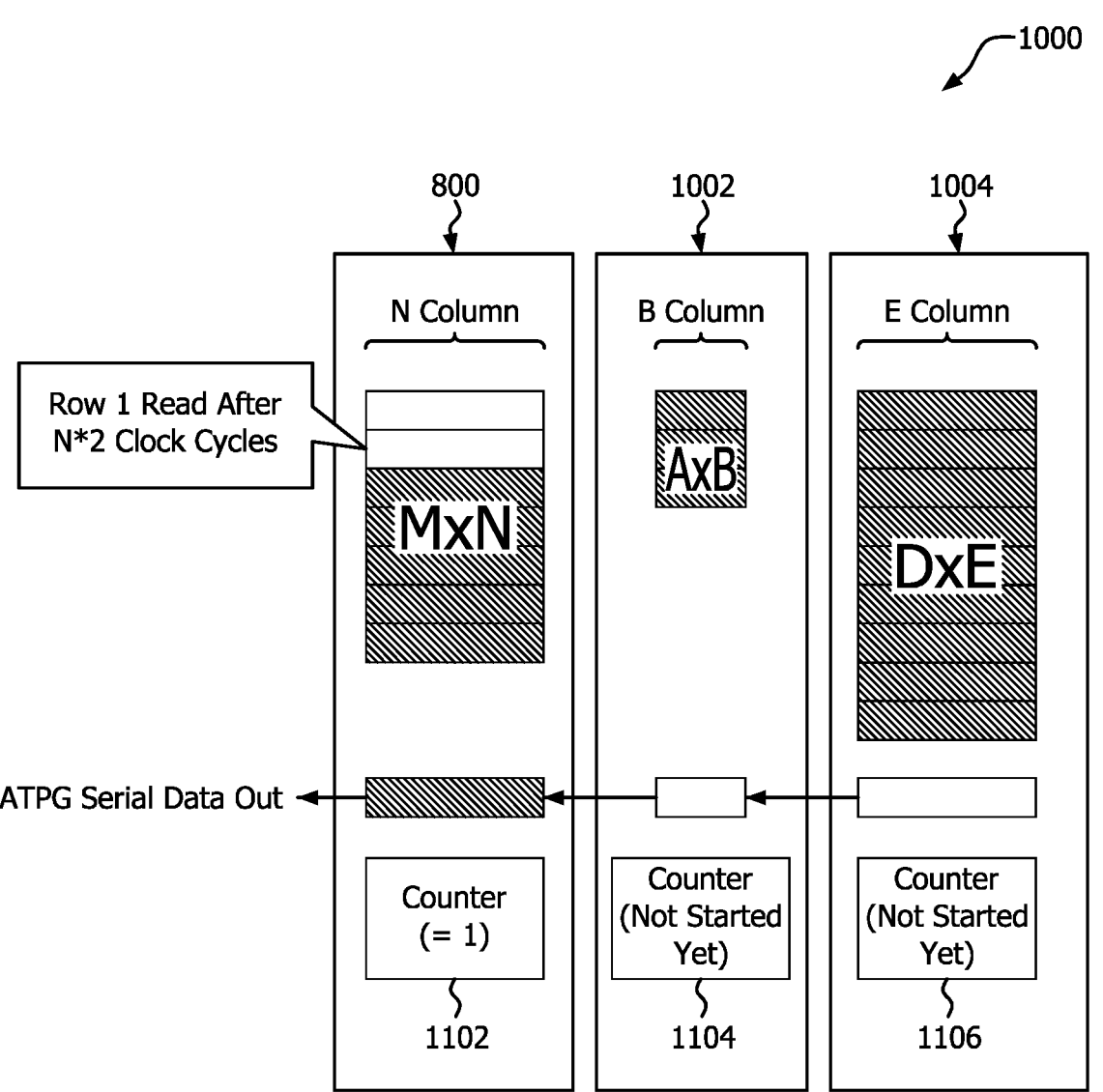
FIG. 16 is a block diagram illustrating read operations where read data is read from the memory pool shown and described with respect to FIG. 10.

FIG. 16 is a block diagram illustrating example read operation of example memory pool 1000 for the second N clock cycles (i.e., clock cycle N+1 through clock cycle N*2). At each clock cycle, a column of data is read from the second row (row 1) of memory 800. Row 1 of memory 800 is fully written after N*2 clock cycles. After N*2 clock cycles, BIST counter 1102 increments (in this example, to a value of 2). Each row of memory 800 is read in this way until counter 1102 saturates (in this case, at a value of M).

Figure 17:
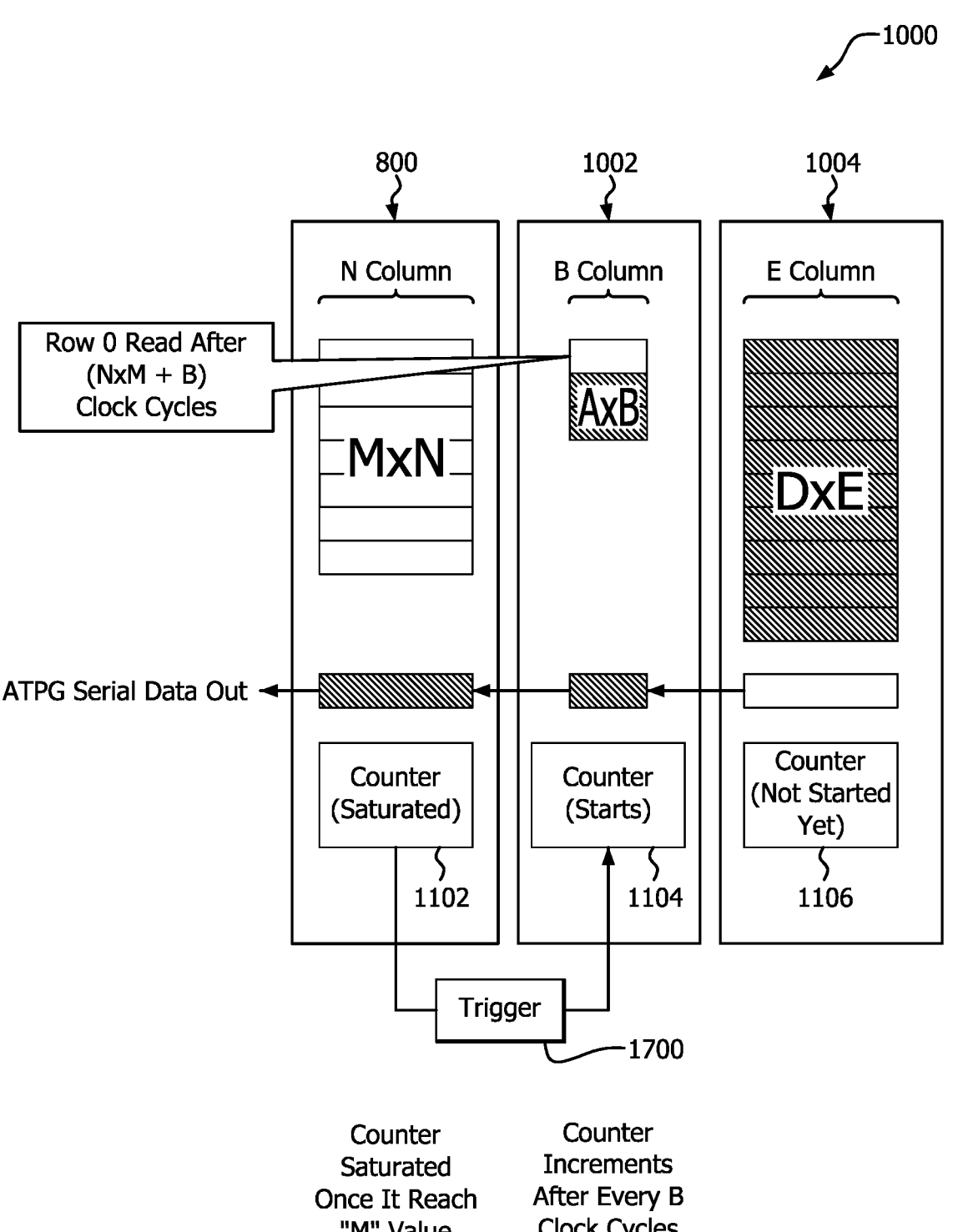
FIG. 17 is a block diagram illustrating read operations where read data is read from the memory pool shown and described with respect to FIG. 10.

FIG. 17 is a block diagram illustrating example read operation of example memory pool 1000 for the first B clock cycles after memory 800 is fully read (i.e., clock cycle N*M+1 through clock cycle N*M+B). The saturation of counter 1102 results in a trigger 1700 for the start of the BIST counter for the next memory of memory pool 1000 (in this example, memory 1002).

At each clock cycle, a column of data is read from the first row (row 0) of memory 1002. Row 0 of memory 1002 is fully written after B clock cycles from the beginning of read from memory 1002 (or, N*M+B clock cycles from the beginning of read from memory pool 1000) after which, BIST counter 1104 increments (in this example, to a value of 1). Operation proceeds whereby row 1 of memory 1002 is fully read after B*2 clock cycles from the beginning of write to memory 1002, and so forth, and each row of memory 1002 is read in this way until counter 1104 saturates (in this case, at a value of A).

Figure 18:
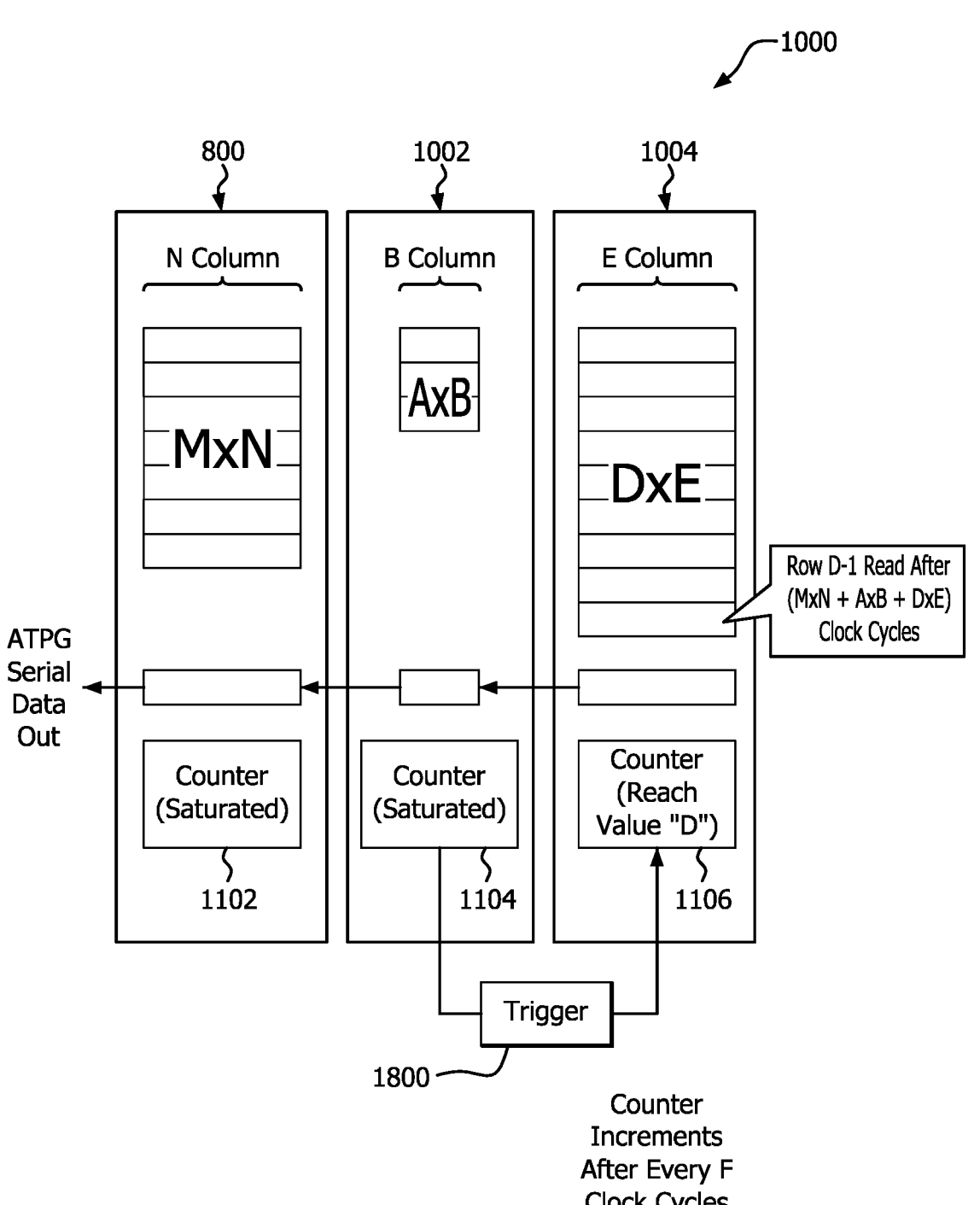
FIG. 18 is a block diagram illustrating read operations where read data is read from the memory pool shown and described with respect to FIG. 10.

FIG. 18 is a block diagram illustrating example read operation of example memory pool 1000 after N+B+E clock cycles from the beginning of write to memory pool 1000. The saturation of counter 1104 results in a trigger 1800 for the start of the BIST counter for the next memory of memory pool 1000 (in this example, memory 1004). Operation proceeds whereby each row of memory 1004 is fully read after each subsequent E clock cycles from the beginning of read from memory 1004, until counter 1106 saturates (in this case, at a value of E). At this point, memory pool 1000 has been fully read.

Figure 19:
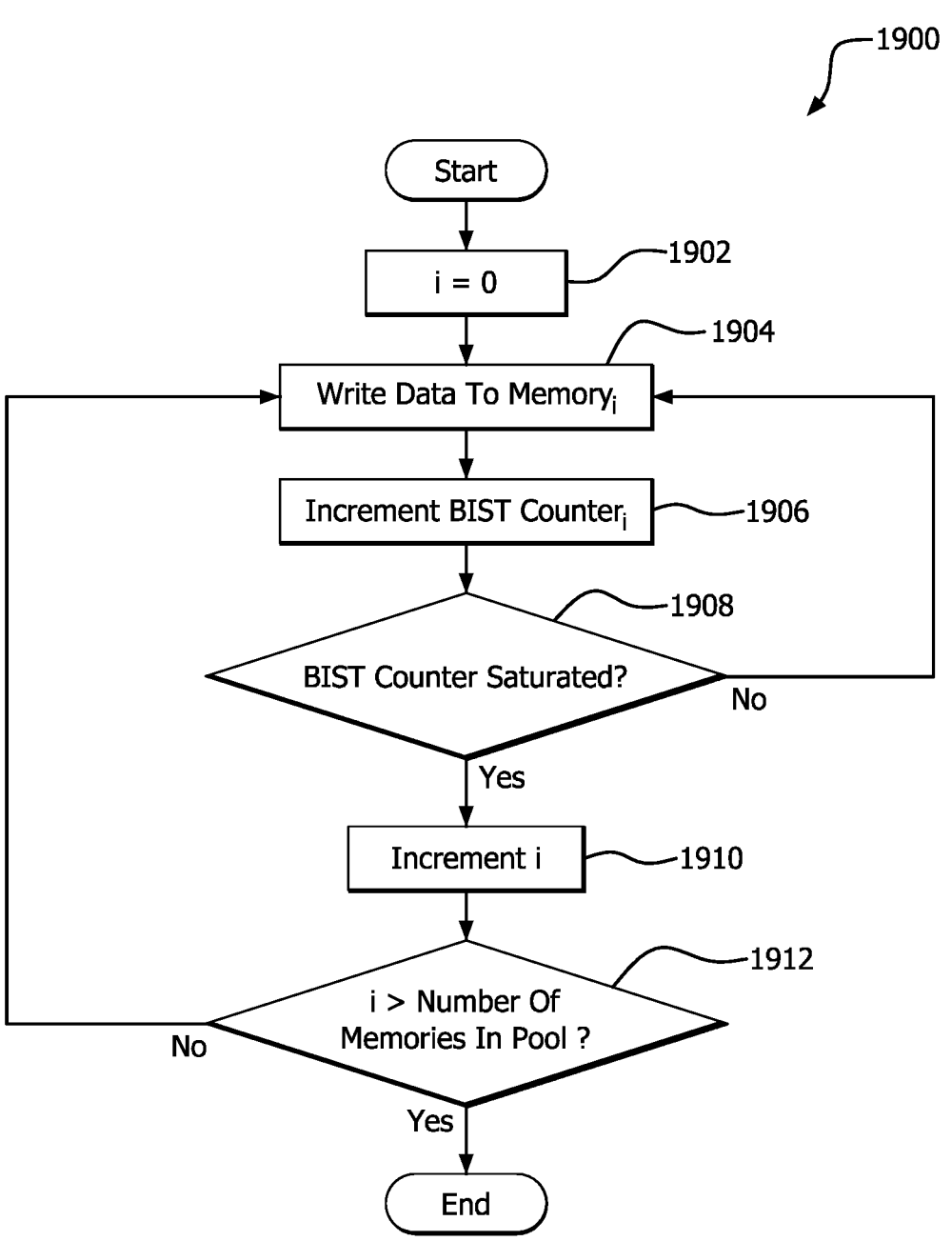
FIG. 19 is a flow chart illustrating an example method for writing to a memory pool.

FIG. 19 is a flow chart illustrating an example method 1900 for writing to a memory pool, e.g., as shown and described with respect to FIGS. 11-14. Method 1900 is illustrative, however other implementations include additional elements, omit elements, combine elements, separate elements, and/or perform elements in a different order. Method 1900 is implementable using any suitable circuitry, e.g., as shown and described with respect to FIGS. 1-18.

At 1902, a memory counter i is initialized to i=0, and BIST counters for each memory of the memory pool are initialized to 0. Memory counter i is used to track the current memory of the memory pool which is being written, and the BIST counters are used to track which portion (e.g., line) of each memory is being written. It is noted that these counters are exemplary, and other ways of tracking the current memory and/or portion of the current memory are usable in other implementations.

At 1904, data is written to the $i^{th}$ memory, and the BIST counter for the $i^{th}$ memory is incremented at 1906. On condition 1908 that the BIST counter for the $i^{th}$ memory is saturated (i.e., indicates the last portion of the $i^{th}$ memory), i is incremented at 1910; otherwise, method 1900 returns to 1904 where data is written to the next portion of the $i^{th}$ memory, indicated by the value of the BIST counter for the $i^{th}$ memory. After i is incremented at 1910, on condition 1912 that i>the number of memories in the memory pool (i.e., the last memory has been fully written), method 1900 ends; otherwise, method 1900 returns to 1904 where data is written to the next portion of the $i^{th}$ memory.

Figure 20:
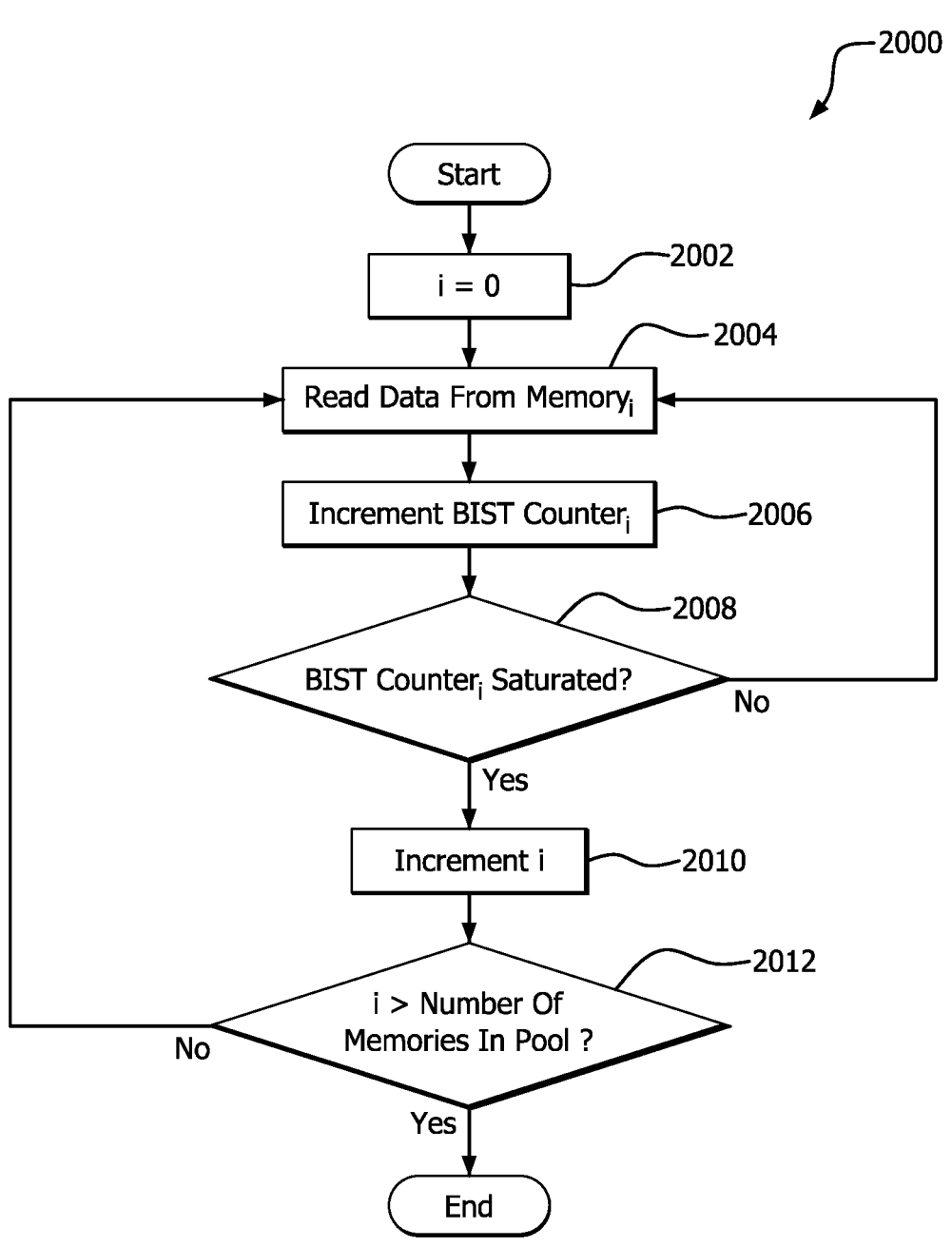
FIG. 20 is a flow chart illustrating the example method for reading from a memory pool.

FIG. 20 is a flow chart illustrating an example method 2000 for reading from a memory pool, e.g., shown and described with respect to FIGS. 15-18. Method 2000 is illustrative, however other implementations include additional elements, omit elements, combine elements, separate elements, and/or perform elements in a different order. Method 2000 is implementable using any suitable circuitry, e.g., as shown and described with respect to FIGS. 1-18.

At 2002, a memory counter i is initialized to i=0, and BIST counters for each memory of the memory pool are initialized to 0. Memory counter i is used to track the current memory of the memory pool which is being read, and the BIST counters are used to track which portion (e.g., line) of each memory is being read. It is noted that these counters are exemplary, and other ways of tracking the current memory and/or portion of the current memory are usable in other implementations.

At 2004, data is read from the $i^{th}$ memory, and the BIST counter for the $i^{th}$ memory is incremented at 2006. On condition 2008 that the BIST counter for the $i^{th}$ memory is saturated (i.e., indicates the last portion of the $i^{th}$ memory), i is incremented at 2010; otherwise, method 2000 returns to 2004 where data is read from the next portion of the $i^{th}$ memory, indicated by the value of the BIST counter for the $i^{th}$ memory. After i is incremented at 2010, on condition 2012 that i>the number of memories in the memory pool (i.e., the last memory has been fully read), method 2000 ends; otherwise, method 2000 returns to 2004 where data is read from the next portion of the $i^{th}$ memory.

It should be understood that many variations are possible based on the disclosure herein. Although features and elements are described above in particular combinations, each feature or element can be used alone without the other features and elements or in various combinations with or without other features and elements.

The various functional units illustrated in the figures and/or described herein (including, but not limited to, the processor 102, the input driver 112, the input devices 108, the output driver 114, the output devices 110, the accelerated processing device 116, the scheduler 136, the graphics processing pipeline 134, the compute units 132, the SIMD units 138, may be implemented as a general purpose computer, a processor, or a processor core, or as a program, software, or firmware, stored in a non-transitory computer readable medium or in another medium, executable by a general purpose computer, a processor, or a processor core. The methods provided can be implemented in a general purpose computer, a processor, or a processor core. Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors can be manufactured by configuring a manufacturing process using the results of processed hardware description language (HDL) instructions and other intermediary data including netlists (such instructions capable of being stored on a computer readable media). The results of such processing can be maskworks that are then used in a semiconductor manufacturing process to manufacture a processor which implements features of the disclosure.

The methods or flow charts provided herein can be implemented in a computer program, software, or firmware incorporated in a non-transitory computer-readable storage medium for execution by a general purpose computer or a processor. Examples of non-transitory computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. An integrated circuit configured for self-test, comprising:

interface circuitry configured to communicate test data between a device outside of the integrated circuit and the integrated circuit;

storage circuitry configured to store the test data in memory of the integrated circuit; and test circuitry configured to place the integrated circuit in a self-test mode, wherein the self-test mode:

isolates circuitry other than the interface circuitry from testing and prevents communication with the device outside of the integrated circuit, and tests the interface circuitry using the test data retrieved from the memory of the integrated circuit by applying the test data as input to the interface circuitry and comparing output produced by the interface circuitry with expected output data stored in the memory.

2. The integrated circuit of claim 1, wherein the interface circuitry is configured to receive the test data from an external storage device.

3. The integrated circuit of claim 1, wherein the memory of the integrated circuit comprises a plurality of memories, wherein the plurality of memories are on a same die as the integrated circuit, are within a same package as the integrated circuit, or are both on a same die as the integrated circuit and within a same package as the integrated circuit.

4. The integrated circuit of claim 1, wherein the memory of the integrated circuit comprises a memory pool.

5. The integrated circuit of claim 1, wherein the memory of the integrated circuit comprises a plurality of memories, wherein the plurality of memories are configured to be accessed serially, are configured to be written to and read from via built-in self-test (BIST) circuitry, or are both configured to be accessed serially and configured to be written to and read from via BIST circuitry.

6. The integrated circuit of claim 1, wherein the memory comprises a first memory and a second memory; and wherein the interface circuitry is configured to store a first portion of the test data in the first memory on the integrated circuit until the first portion of the test data has been entirely stored in the first memory, and, after the first portion of the test data has been entirely stored in the first memory, to store a second portion of the test data in the second memory on the integrated circuit.

7. The integrated circuit of claim 1, wherein the memory comprises a first memory and a second memory; and wherein the test circuitry is configured to receive a first portion of the test data from the first memory on the integrated circuit until the first portion of the test data has been entirely received from the first memory, and, after the first portion of the test data has been entirely received, receiving a second portion of the test data from the second memory on the integrated circuit.

8. A method for testing an integrated circuit, the method comprising:

storing test data in memory of the integrated circuit over interface circuitry configured to communicate test data between a device outside of the integrated circuit and the integrated circuit; and entering a self-test mode, wherein the self-test mode:

isolates circuitry other than the interface circuitry from testing and prevents communication with the device outside of the integrated circuit, and tests the interface circuitry using the test data retrieved from the memory of the integrated circuit by applying the test data as input to the interface circuitry and comparing output produced by the interface circuitry with expected output data stored in the memory.

9. The method of claim 8, wherein the test data is stored in the memory on the integrated circuit over the interface circuitry of the integrated circuit from an external storage device.

10. The method of claim 8, wherein the memory of the integrated circuit comprises a plurality of memories, wherein the plurality of memories are on a same die as the integrated circuit, are within a same package as the integrated circuit, or are both on a same die as the integrated circuit and within a same package as the integrated circuit.

11. The method of claim 8, wherein the memory of integrated circuit comprises a memory pool.

12. The method of claim 8, wherein the memory of the integrated circuit comprises a plurality of memories, wherein the plurality of memories are configured to be accessed serially, are configured to be written to and read from via built-in self-test (BIST) circuitry, or are both configured to be accessed serially and configured to be written to and read from via BIST circuitry.

13. The method of claim 8, wherein storing the test data in the memory on the integrated circuit over the interface circuitry comprises storing a first portion of the test data in a first memory on the integrated circuit until the first portion of the test data has been entirely stored in the first memory, and, after the first portion of the test data has been entirely stored in the first memory, storing a second portion of the test data in a second memory on the integrated circuit until the second portion of the test data has been entirely stored in the second memory.

14. The method of claim 8, wherein testing the interface circuitry based on the test data comprises receiving a first portion of the test data from a first memory on the integrated circuit until the first portion of the test data has been entirely received from the first memory, and, after the first portion of the test data has been entirely received, receiving a second portion of the test data from a second memory on the integrated circuit until the second portion of the test data has been entirely received from the second memory.

15. The method of claim 8, wherein testing the interface circuitry based on the test data written into the memory of the integrated circuit comprises receiving the test data from the memory of the integrated circuit, applying the test data to the interface circuitry to generate test output data, and comparing the test output data to expected output data stored in the memory while communication with the device outside of the integrated circuit is prevented.

16. An integrated circuit configured for storing data, comprising:

interface circuitry configured to communicate data between a device outside of the integrated circuit and the integrated circuit and storage circuitry configured to store a first portion of the data in a first memory via built-in self-test (BIST) circuitry of the first memory while incrementing a first BIST counter of the first memory until the first BIST counter reaches a terminal saturation count and asserts a hardware trigger;

circuitry configured to, responsive to the asserted hardware trigger, store a second portion of the data in a second memory via BIST circuitry of the second memory while incrementing a second BIST counter of the second memory until the second BIST counter reaches a terminal saturation count; and test circuitry configured to place the integrated circuit in a self-test mode, wherein the self-test mode:

isolates circuitry other than the interface circuitry from testing, and tests the interface circuitry based on the first portion and the second portion.

17. The integrated circuit of claim 16, further comprising circuitry configured to trigger storing of the second portion of the data in the second memory based on saturation of the first BIST counter.

18. The integrated circuit of claim 16, wherein the first memory and the second memory are comprised of the integrated circuit or an integrated circuit die, and the integrated circuit comprises circuitry configured to receive the data from a memory device that is external to the integrated circuit or to the integrated circuit die.

19. The integrated circuit of claim 16, wherein the first memory and the second memory are comprised of an integrated circuit package, and the integrated circuit comprises circuitry configured to receive the data from a memory device that is external to the integrated circuit package.

20. The integrated circuit of claim 1, wherein the self-test mode prevents communication with the device outside of the integrated circuit and configures the interface circuitry to be exercised exclusively using the test data and expected output data retrieved from the memory of the integrated circuit.

* * * * *